(12) United States Patent
Chen et al.

(10) Patent No.: US 10,461,505 B2
(45) Date of Patent: Oct. 29, 2019

(54) HIGH BRIGHTNESS COHERENT MULTI-JUNCTION DIODE LASERS

(71) Applicant: nLIGHT, Inc., Vancouver, WA (US)

(72) Inventors: Zhigang Chen, Portland, OR (US); Manoj Kanskar, Portland, OR (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 15/479,206

(22) Filed: Apr. 4, 2017

(65) Prior Publication Data

US 2017/0288370 A1    Oct. 5, 2017

Related U.S. Application Data

(60) Provisional application No. 62/318,136, filed on Apr. 4, 2016.

(51) Int. Cl.
*H01S 5/30* (2006.01)
*H01S 5/40* (2006.01)
*G02B 27/10* (2006.01)
*G02B 27/14* (2006.01)
*H01S 5/026* (2006.01)
*H01S 5/00* (2006.01)
*H01S 5/022* (2006.01)

(52) U.S. Cl.
CPC .......... *H01S 5/3095* (2013.01); *G02B 27/106* (2013.01); *G02B 27/145* (2013.01); *H01S 5/4043* (2013.01); *H01S 5/005* (2013.01); *H01S 5/026* (2013.01); *H01S 5/02252* (2013.01); *H01S 5/02284* (2013.01); *H01S 5/405* (2013.01); *H01S 5/4012* (2013.01); *H01S 5/4018* (2013.01); *H01S 5/4068* (2013.01); *H01S 5/4081* (2013.01)

(58) Field of Classification Search
CPC .... H01S 5/3095; H01S 5/3425; H01S 5/4043; H01S 5/4081; H01S 5/005
See application file for complete search history.

(56) References Cited

U.S. PATENT DOCUMENTS

| 5,166,761 A | 11/1992 | Olson et al. |
| 5,212,706 A | 5/1993 | Jain |
| 5,452,316 A | 9/1995 | Seki et al. |

(Continued)

FOREIGN PATENT DOCUMENTS

DE    102009026526    12/2010

OTHER PUBLICATIONS

International Search Report and Written Opinion from International Application No. PCT/US2017/025990, dated Aug. 28, 2017, 16 pages.

(Continued)

*Primary Examiner* — Michael Carter
(74) *Attorney, Agent, or Firm* — Klarquist Sparkman, LLP

(57) ABSTRACT

Laser diodes formed on a common substrate with layers of suitable thickness and refractive indices produce output beams that are coherently coupled. A phase mask can be situated to produce phase differences in one or more of the output beams to produce a common wavefront phase. The phase-corrected beams propagate with reduced angular divergence than conventional lasers that are not coherently coupled, and the coherently coupled laser diodes can provide higher beam brightness, enhanced beam parameter product, and superior power coupled into doped fibers in fiber lasers.

31 Claims, 19 Drawing Sheets

(56) References Cited

U.S. PATENT DOCUMENTS

| | | | |
|---|---|---|---|
| 7,646,799 B2 * | 1/2010 | Brick | B82Y 20/00 372/50.1 |
| 8,884,267 B2 | 11/2014 | Lin et al. | |
| 9,270,085 B1 | 2/2016 | Kanskar | |
| 2005/0069255 A1 * | 3/2005 | Nishimura | G02B 6/4206 385/31 |
| 2015/0255960 A1 | 9/2015 | Kanskar | |

OTHER PUBLICATIONS

International Preliminary Report on Patentability from International Application No. PCT/US2017/025990, dated Oct. 9, 2018, 8 pages.

\* cited by examiner

FIG. 10A 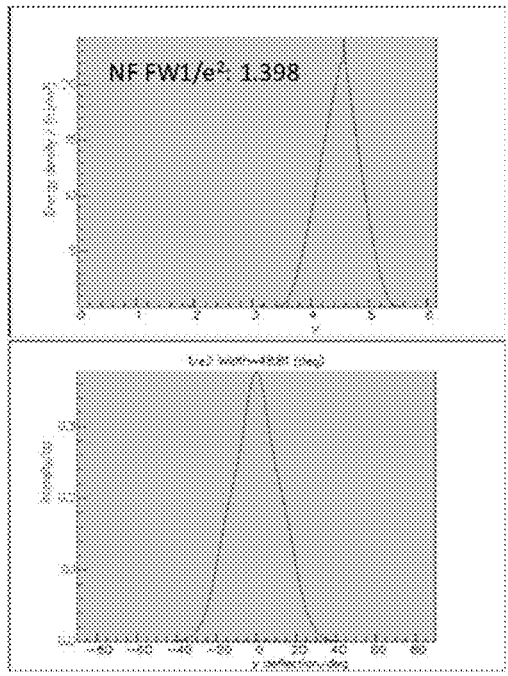 FIG. 10B 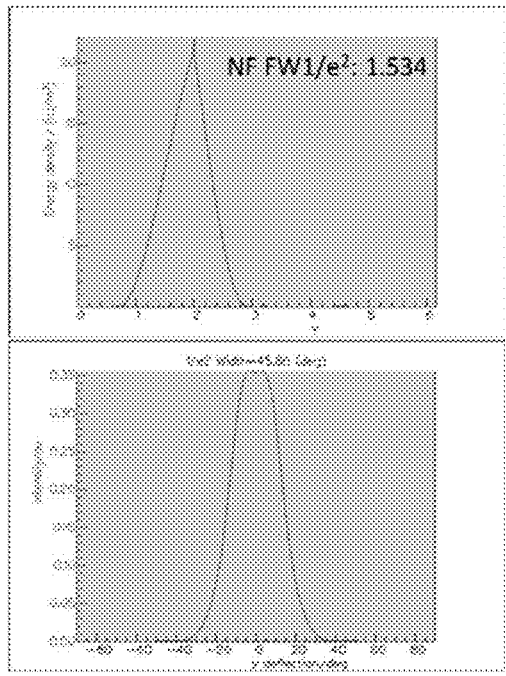
FIG. 10C FIG. 10D
FIG. 11A 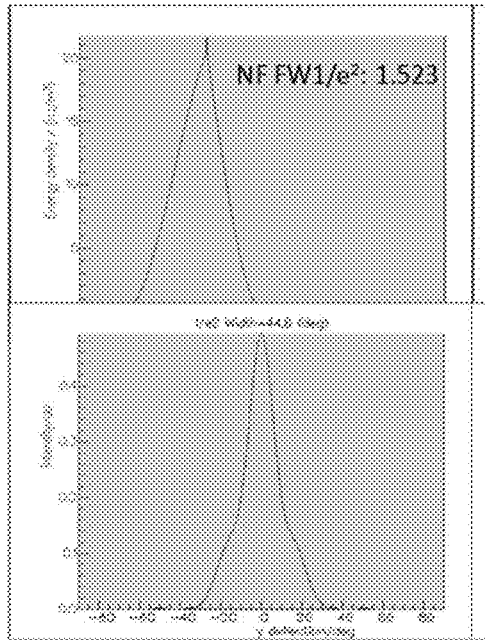 FIG. 11B 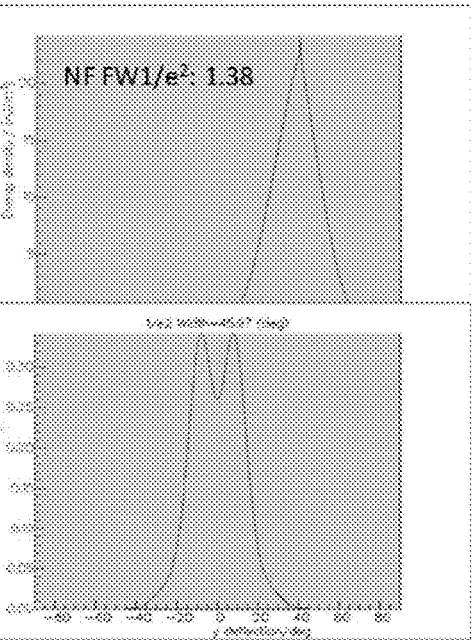
FIG. 11C FIG. 11D

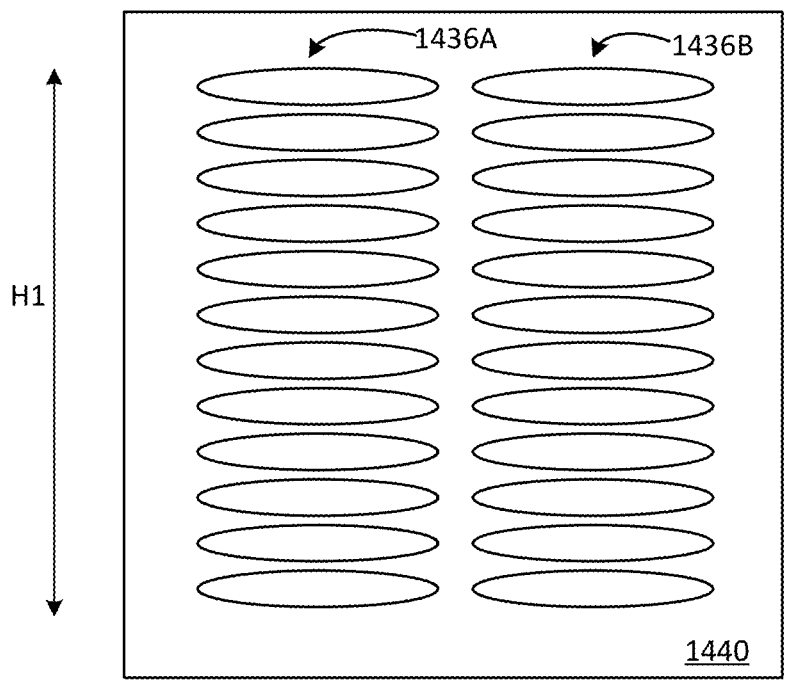
FIG. 14B
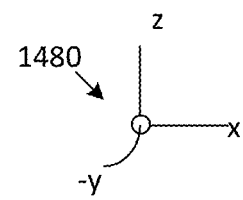
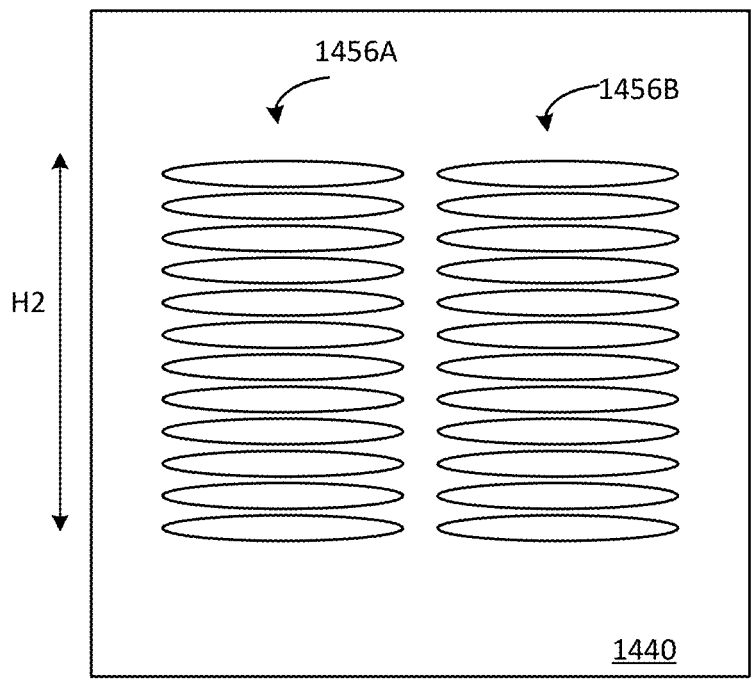
FIG. 14C
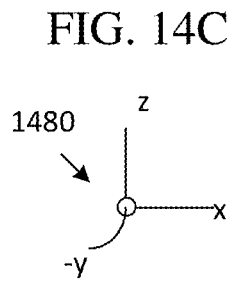

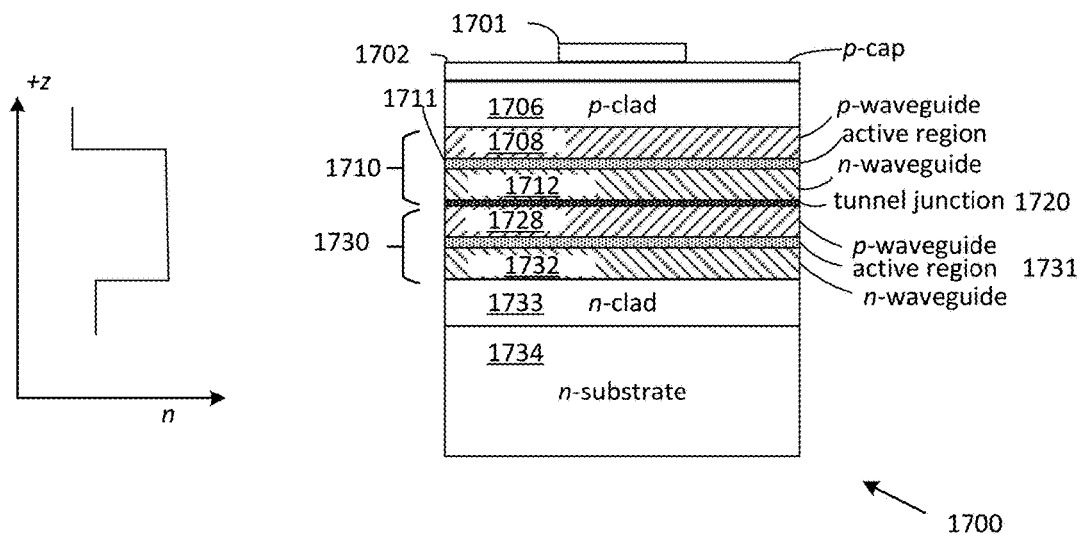
FIG. 17B          FIG. 17A
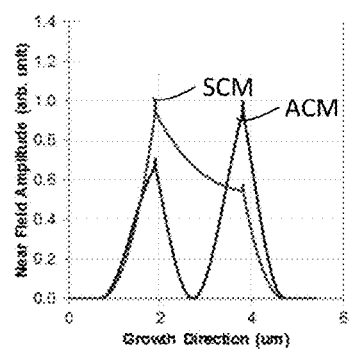   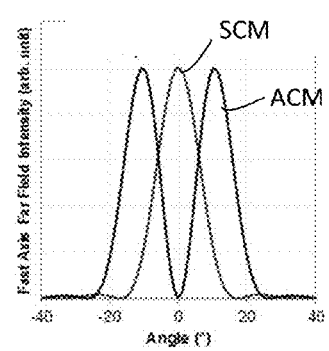
FIG. 18B          FIG. 18A

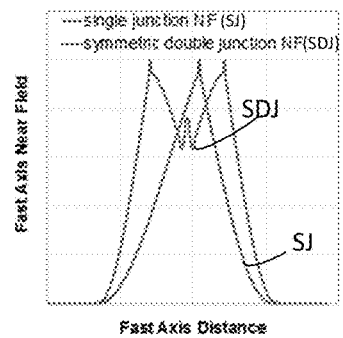
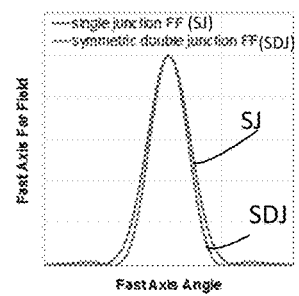
FIG. 21A
FIG. 21B
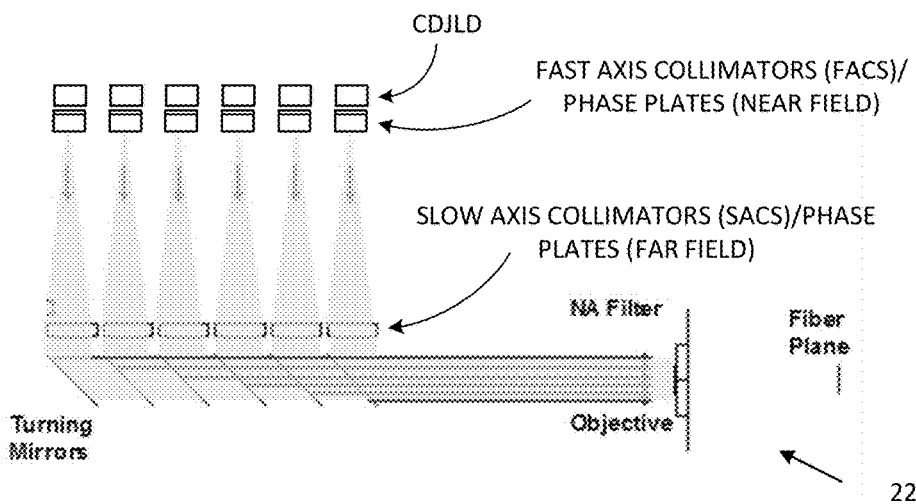
FIG. 22

HIGH BRIGHTNESS COHERENT MULTI-JUNCTION DIODE LASERS

CROSS REFERENCE TO RELATED APPLICATION

This application claims the benefit of U.S. Provisional Application No. 62/318,136, filed Apr. 4, 2016, which is incorporated herein by reference in its entirety.

FIELD

The disclosure pertains to laser diodes.

BACKGROUND

Power scaling per chip in semiconductor diode lasers can be provided using a bipolar cascade in which multiple lasers are epitaxially grown monolithically in electrical series on a single substrate, separated by tunnel junctions (TJs). While an N junction bipolar cascade laser could theoretically increase the output power by a factor of N over a conventional single junction device, the brightness in the multi-junction diode laser is generally lower than that of the single junction due to relatively thick spacer layers between laser junctions. For example, the theoretical fast axis near field and far field intensities of conventional single junction and incoherent double junction 885 nm diode lasers are shown in FIGS. 1A-1B as curves 102, 104 and 112, 114, respectively. The far field divergence (see FIG. 1B) of the incoherent double junction diode laser (curve 304) is substantially the same as that of the single junction because the optical modes in the two junctions have no coherence with each other. However, as shown in FIG. 1A, the near field size along a growth direction (fast axis) is much more than twice that of the single junction, due to the insertion of a spacer layer between the two laser junctions to minimize optical modal loss at the TJ. This leads to lower brightness even after the power is doubled in the double junction laser. The specific 885 nm single junction diode laser illustrated in FIGS. 1A-1B has a fast axis brightness of 34.4 W/mm-mrad for 10 W output power, while the incoherent double junction laser has a brightness of 19.1 W/mm-mrad for 20 W output power. Thus, while bipolar laser cascades can provide increased power, such devices exhibit lower brightness than single emitter laser diodes, and thus do not improve over single emitters in many applications such as the pumping of fiber lasers.

SUMMARY

The general approach disclosed herein to improved brightness in multi-junction diode lasers is to move the laser junctions closer (at least "optically closer") by reducing spacer layer thickness between the junctions or decreasing refractive index contrast. However, the closer the laser junctions are, the more the evanescent waves associated with radiation generation in the active lasers overlap with the tunnel junctions, at which the optical loss is generally high, resulting in lower power and brightness. As the spacer thickness is further reduced and/or the index of refraction contrast between the waveguide layers and spacer cladding becomes sufficiently low, the optical modes from the different laser junctions become coherently coupled. Consequently, the coherent coupling increases fast axis brightness, as well as suppresses the performance penalty at the tunnel junctions as there is zero (or very low) optical field strength for antisymmetric modes at tunnel junction locations. In this way, an antisymmetric mode can be generated that provides both higher brightness and lower loss.

Multi-emitter laser diodes comprise a first active region associated with a lasing wavelength situated between an inner waveguide layer and an outer waveguide layer and a second active region associated with the lasing wavelength situated between an inner waveguide layer and an outer waveguide layer. The inner waveguide layer of the first active region and the inner waveguide layer of the second active region are situated between the first active region and the second active region. The first active region and the second active region are situated so that an optical beam propagating in the first active region is optically coupled to the second active region through the inner waveguide layers. In some examples, at least one of the inner waveguide layers associated with the first and second active regions has a thickness such that the first active region and the second active region are optically coupled. In still further examples, the inner waveguide layers associated with the first and second active regions have thicknesses such that the first active region and the second active region are optically coupled.

In some embodiments, the inner waveguide layers associated with the first and second active regions have a common thickness. In particular examples, the inner waveguide layers associated with the first and second active regions have a combined thickness of less than 4, 3, 2, 1, 0.5, 0.2, or 0.1 times the lasing wavelength. In other examples, a separation of the first active region and the second active region is less than 2, 1, 0.5, 0.2, or 0.1 times the lasing wavelength.

According to some examples, a tunnel junction is situated between the inner waveguide layer associated with the first active region and the inner waveguide layer associated with the second active region. The tunnel junction is situated between a first spacer layer and a second spacer layer situated at the inner waveguide layer associated with the first active region and the inner waveguide layer associated with the second active region, respectively. In still further examples, a refractive index difference between at least one of the inner waveguide layer associated with the first active region and the first spacer layer and the inner waveguide layer associated with the second active region and the second first spacer layer is less than 0.5, 0.4 0.3, 0.25, 0.2, 0.15, 0.1, or 0.05. More closely spaced active regions can be optically coupled with larger refractive index differences, and suitable combinations can be chosen as convenient. In some examples, a refractive index difference between the inner waveguide layer associated with the first active region and the first spacer layer is less than a first value, and a refractive index difference between the inner waveguide layer associated with the second active region has a second value that is different than the first value. In some embodiments, the first spacer layer and the second spacer layer have a total thickness that is less than 0.4λ.

Apparatus comprise at least one coherent multi-junction laser diode, and a phase mask situated with respect to the multi-junction laser diode so as to produce a phase shift between optical beams produced by at least two of the multi-junctions. In some examples, the phase mask has phase segments so that the relative phase shift is 180 degrees. In other examples, the coherent multi-junction laser diode is a coherent double junction laser diode. In additional examples, the coherent multi-junction laser diode is selected to produce an antisymmetric mode or a symmetric mode.

Methods of pumping a fiber laser comprise producing a coherent beam from a combination of a first optical beam and a second optical beam from a first laser diode and a second laser diode, respectively. A wavefront phase of at least the first optical beam or the second optical beam is adjusted and the wavefront phase adjusted beam is directed to a doped optical fiber to produce optical gain in the doped optical fiber. In some cases, the phase is adjusted to produce a symmetric mode or an antisymmetric mode.

Methods of producing a coherent double-emitter laser diode comprise defining a first laser diode in at least one or more layers on a substrate and forming a tunnel junction adjacent the first laser diode. A second laser diode is defined in at least one or more layers adjacent the tunnel junction, wherein the first laser diode and the second laser diode are optically coupled so as to produce coherent first and second laser beams. In typical examples, the first laser diode and the second laser diode are optically coupled based on at least one of a separation of active regions associated with the first laser diode and the second laser diode, a tunnel junction thickness, and a refractive index difference.

These and other features and aspects of the disclosed technology are set for the below with reference to the accompanying drawings.

BRIEF DESCRIPTION OF THE DRAWINGS

FIGS. 10A-10B and 10C-10D illustrate near field intensities and far field intensities associated with symmetric and antisymmetric beam modes, respectively, produced by a double junction 885-nm diode laser similar to that of FIG. 2A with total spacer layer thickness that is twice that of the FIG. 2A configuration.

FIGS. 11A-11B and 11C-11D illustrate near field intensities and far field intensities associated with symmetric and antisymmetric beam modes, respectively, produced by a double junction 885-nm diode laser similar to that of FIG. 2A with a refractive index different between waveguide and spacer-cladding layers that is twice that of the FIG. 2A configuration.

FIGS. 14B-14C illustrate a beam stack before and after compression.

FIG. 17A illustrates an epitaxial layer stack associated with a single waveguide coherent double junction laser diode in which cladding layers are not provided at the tunnel junction.

FIG. 17B illustrates refractive index of the epitaxial stack of FIG. 17A as a function of position along a growth direction.

FIGS. 18A-18B illustrate fast axis far field intensity as a function of angle and near field intensity as a function of position in a growth direction for symmetric and antisymmetric modes of a single waveguide coherent double junction laser diode such as illustrated in FIGS. 17A-17B.

FIG. 19B shows modeled near field relative intensity as a function of growth direction.

FIGS. 21A-21B are graphs representing fast axis near field intensity and fast axis far field intensity of a symmetric double junction 976-nm diode laser as functions of near field position and far field angle along the fast axis. For comparison, near field and far field intensities for a conventional single junction diode laser with the same junction thickness is also shown.

FIG. 22 illustrates coupling of beams from multiple coherent double junction laser diodes (CDJLDs) into a fiber using phase compensators situated in a near field or a far field, and conveniently provided as part of fast or slow axis collimators.

DETAILED DESCRIPTION

Figure 1A:
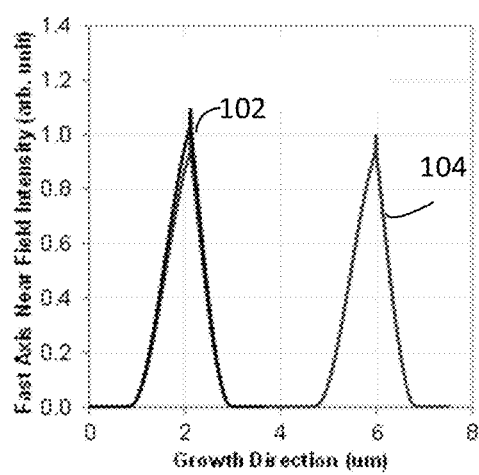
FIGS. 1A-1B illustrate near field intensity as a function of position in a growth direction and fast axis far field intensity as a function of angle for a conventional single junction laser diode and incoherent double junction laser diode, respectively.

As used in this application and in the claims, the singular forms "a," "an," and "the" include the plural forms unless the context clearly dictates otherwise. Additionally, the term "includes" means "comprises."

The described systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods which function in the manner described by such theories of operation.

In the following description, laser beams or other propagating optical radiation are referred as propagating along one or more axes. As used herein, such an axis refers to a linear axis that can bent or folded using optical elements such as prisms or mirrors. In some examples, optical elements such as cylindrical lenses or spherical lenses are referred to as centered or on-axis so as to indicate lenses having a central axis that is directed through surface centers of curvature. In other examples, off-axis lenses or lens segments can be used. Optical surfaces can be provided with anti-reflection or other coatings, but are such coatings are omitted from the disclosed examples. Beams, surfaces, and axes are generally referred to as parallel if within about 1 degree, 2 degrees, or 5 degrees.

A laser diode typically emits laser radiation from a facet that is much longer in one direction than in an orthogonal direction so that the emitted laser radiation has a smaller divergence in a direction parallel to the longer facet dimension and a larger divergence in a direction parallel to the smaller facet dimension. An axis parallel to and along the longer facet dimension is referred to as a "slow axis;" and an axis parallel to and along a smaller facet dimension is referred to as a "fast axis." In the examples below, mode coupling and modes with respect to the fast axis are typically described.

Lasing wavelength refers to actual emission wavelength of a laser diode. In addition, as actual emission wavelength varies with temperature, drive current, laser cavity length, as used herein, lasing wavelength also refers to a spectral bandwidth at which a laser diode can emit, or a spectral bandwidth over which optical gain is at least 50%, 75%, 80%, 90%, 95%, or 98% of peak gain. In order to produce coherent coupling, laser diodes have common lasing wavelengths and/or gain bandwidth overlaps. "Active region" refers generally to portions of laser diodes that produce optical gain. In quantum well lasers, the quantum well layers serve as active regions, while in homojunction, heterostructure, and double heterostructure laser diodes, the active region is defined by junctions between materials having different bandgaps.

In the following examples, so-called quantum well lasers are described that include quantum well based active regions, but other active regions or laser diode configurations such as double heterostructure lasers can be used. In some examples, so-called separate confinement heterostructure (SCH) quantum well laser diodes are described in which additional layers typically referred to as waveguide or confinement layers are used. Multiple quantum well active regions can be used, and such quantum wells can be defined by planar structures, arrays of quantum dots or quantum wires. In typical examples, multiple laser diode emitters are defined by epitaxial growth or otherwise on a substrate, and situated in proximity so that a propagating optical mode in each active region is coupled to optical modes propagating in at least one other laser diode. This coupling is provided along the so-called fast axis and can be obtained by providing waveguide layers or cladding layers separating the active regions that are sufficiently thin or have suitable refractive index differences. Slow axis propagation and laser diode geometry typically remain unchanged from conventional laser diode structures. Coherent coupling can result from evanescent coupling from one active region to another. In many practical examples, active regions are separated by tunnel junctions so that multiple active regions can be energized with a single drive current or voltage. Because optical modes in the multiple emission regions are optically coupled, such emitters are referred to herein as coherent multi-junction laser diodes.

Coherent coupling can be accomplished by situating emission regions in proximity, typically so that emission regions are separated by less than $5\lambda$, $2\lambda$, $1\lambda$, $0.8\lambda$, $0.5\lambda$, $0.2\lambda$, or $0.1\lambda$, wherein $\lambda$ is a free space wavelength of an emitted laser beam or lasing wavelength. To obtain such spacings, various layers that define the coupled laser diodes are made sufficiently small, at least those layers that are situated between emission regions. Layer thicknesses that are less than $2\lambda$, $1\lambda$, $0.8\lambda$, $0.5\lambda$, $0.2\lambda$, $0.1\lambda$, $0.05\lambda$, or smaller can be used. In addition, refractive index differences between layers can be adjusted to enhance evanescent coupling. Smaller refractive index differences such differences of less than 0.5, 0.4, 0.3, 0.2, or 0.1 can be used, and variations in thickness and refractive index can be combined to produce coherent coupling.

In some representative coherent multi-junction laser diodes, emission regions are uniformly spaced, while in other examples, spacings between emission regions are varied. By adjusting spacings, a coherent beam having a preferred beam profile can be produced. In typically disclosed examples having two emission regions, emission in a symmetric mode such as a lowest order mode or an antisymmetric mode having a central minimum is produced. Coherent coupling produces pronounced effects in far field radiation pattern as coherent emission produced by the combined emission regions diverges (i.e., diffracts) based on a dimension of the combined emission regions.

Coherent multi-junction laser diodes can be made for operation over a wide range of wavelengths depending on selected materials. For example, such laser diodes can be made of InGaN, AlGaInP, GaAlAs, InGaAs, GaAsP, InGaAsP, InGaAsNSb, GaInAsSb for wavelengths that range from at least about 400 nm (InGaN) to about 3.4 μm (GaInAsSb).

In some examples, quantum well lasers include tunnel junctions based on highly doped layers that generally exhibit optical losses so that modes resulting from coupling between multiple active regions tend to have relative minima at output beam locations associated with the tunnel junctions. As a result, for a typical coherent double junction laser diode, an output mode has a central minimum, and a lowest order symmetric mode is not typically produced. While such a mode has two lobes, the lobes are out of phase by 180 degrees. In some disclosed examples, a phase mask or other optical device is provided that compensates for this phase difference so that an output beam has a constant phase front even though beam intensity has a central minimum.

Coherent Double Junction Laser Diode

Figures 2A, 2B:
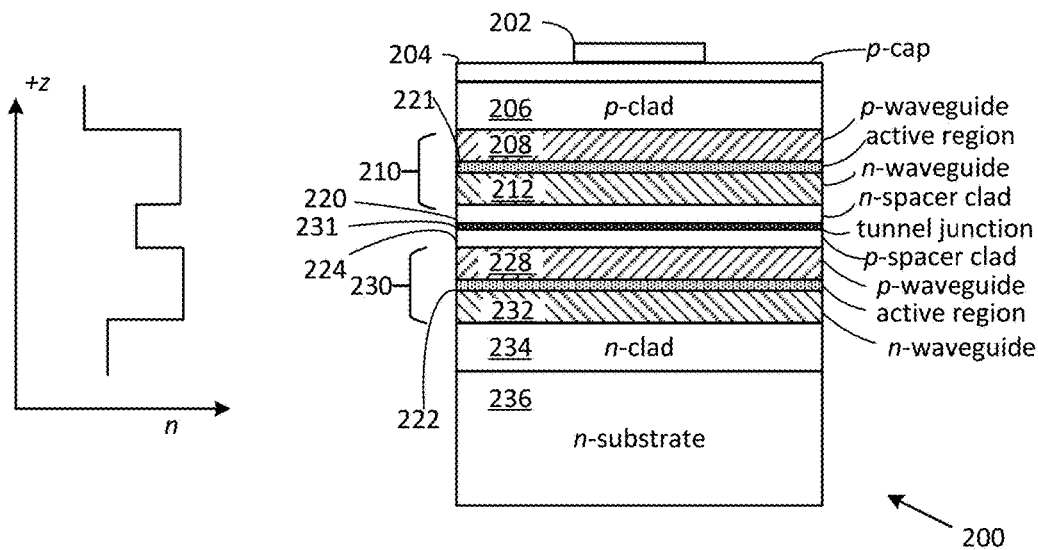
FIG. 2A illustrates an epitaxial layer stack associated with a double waveguide coherent double junction laser diode.
FIG. 2B illustrates refractive index of the epitaxial stack of FIG. 2A as a function of position along a growth direction.

Referring to FIG. 2A, a representative coherent double junction laser diode 200 includes a first active region 221 and a second active region 222. Typically, compositions of the first active region 221 and the second active region 222 are selected to provide optical gain over substantially overlapping spectral bands, and in some cases, over nearly identical spectral bands. However, in other examples, different, distinct, or widely separated spectral gain bandwidths are selected. The first active region 221 is situated between an outer p-waveguide layer 208 and an inner n-waveguide layer 212; the second active region 222 is situated between an inner p-waveguide layer 228 and an outer n-waveguide layer 232. A p-clad layer 206 is in contact with the p-waveguide region 208 and a p-cap layer 204 separates the p-clad layer 206 and a top contact 202. The second active layer 222 is situated on an n-clad layer 234 that is formed on an n-substrate 236. Waveguide layers 208, 212 and first active region 221 form a first laser diode 210; waveguide layers 228, 232 and second active region 222 form a second laser diode 230. The second laser diode 230 and the first laser diode 210 are separated by an n-spacer clad layer 220, a tunnel junction 231, and a p-spacer clad layer 224.

Representative layer thickness for the coherent double junction laser diode 200 are provided in the table below. Materials and compositions are selected based on an intended wavelength or wavelength range, and layer thicknesses are in terms of intended free-space lasing wavelength.

| Layer Description | thickness ($\lambda_0$) | index of refraction | doping |
|---|---|---|---|
| p-cap | | | p-doped |
| p-clad | | 3.1 | p-doped |
| outer p-waveguide | 1 | 3.4 | p-doped |
| active region | | | |
| inner n-waveguide | 1 | 3.4 | n-doped |
| n-spacer-clad | 0.2 | 3.2 | n-doped |
| tunnel junction | | | |
| p-spacer-clad | 0.2 | 3.2 | p-doped |
| inner p-waveguide | 1 | 3.4 | p-doped |
| active region | | | |
| outer n-waveguide | 1 | 3.4 | n-doped |
| n-clad | | 3.1 | n-doped |
| n-substrate | | | n-doped |

Figure 1B:
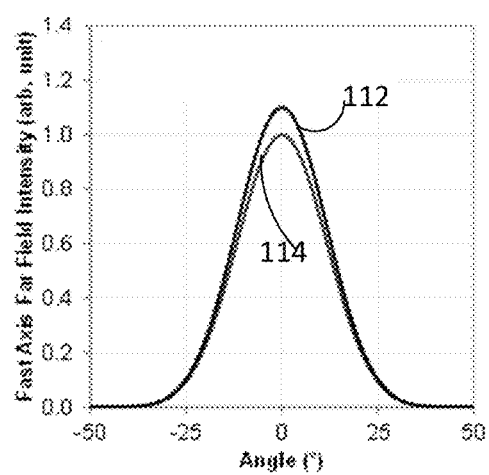
Figures 3A, 3B:
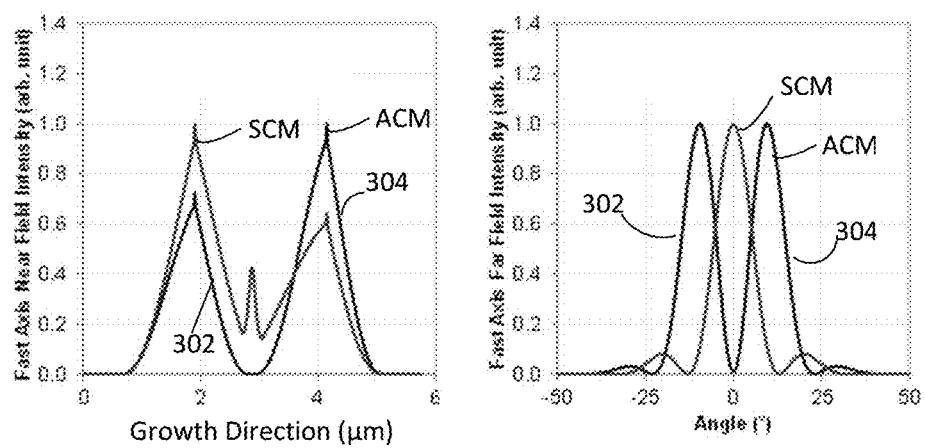
FIGS. 3A-3B illustrate near field intensity as a function of position in a growth direction and fast axis far field intensity as a function of angle for symmetric and antisymmetric modes of a coherent double junction laser diode such as illustrated in FIGS. 2A-2B.

FIGS. 3A-3B show modeled fast axis near field and far field intensities of fundamental (symmetric) mode (referred to herein as a symmetric coherent mode or SCM) in an 885-nm coherent double junction diode such as illustrated in FIG. 2A. The far field divergence is reduced by about 60% from that of single junction and incoherent double junction laser diodes as illustrated in FIG. 1B, while the near field is reduced by about 33% from that of an incoherent double junction laser diode as shown in FIG. 1A. At an output power of 20 W, fast axis brightness for a coherent double junction diode is about 70.6 W/mm-mrad, i.e., 2 and 3.7 times that of an 885-nm single junction laser diode and an incoherent double junction laser diode, respectively. FIGS. 3A-3B also show modeled fast axis near field and far field intensities of an antisymmetric coherent mode (ACM) in an 885-nm coherent double junction diode. The ACM has a substantially symmetric intensity distribution about a beam center, but beam lobes 302, 304 have phases that differ by 180 degrees. Such a mode typically reduces optical losses due to absorption at the tunneling junction that separates the two laser diodes. Although the far field of the ACM has two out of phase lobes 302, 304, and is much wider than that of the symmetric mode, it is still slightly smaller than that of a single junction and an incoherent double junction shown in FIGS. 1A-1B. In one example, a brightness of an antisymmetric coherent mode produced by a coherent double junction laser is 34.6 W/mm-mrad, comparable to that of an 885-nm single junction and greatly improved over an incoherent double junction design.

Coherent Triple and Multi-Junction Laser Diodes

Figure 4:
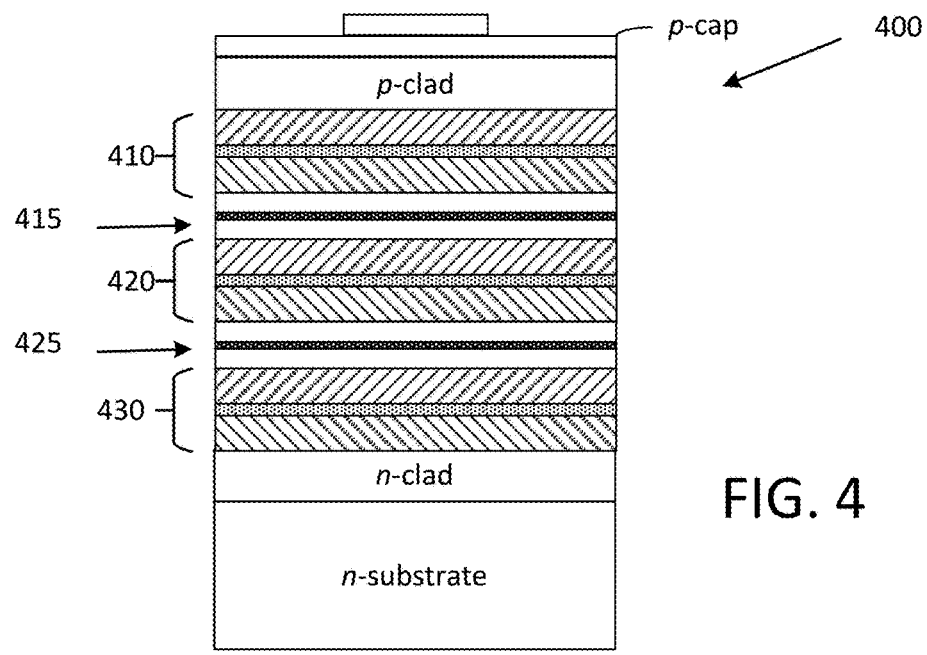
FIG. 4 illustrates an epitaxial layer stack associated with a coherent triple junction laser diode.

With reference to FIG. 4, a three emitter stack 400 includes laser diodes 410, 420, 430, each including an active region and waveguide layers. The laser diodes 410, 420, 430 are separated by tunnel junctions 415, 425, respectively. As shown in FIG. 4, the laser diodes 410, 420, 430 have a common construction, but in other examples, some or all may have different active regions and waveguide layers. In addition, the tunnel junctions 415, 425 can be the same or different. Layer differences in tunnel junctions or laser diode layers can be provided as differing thicknesses, dopant types, or doping concentrations. In addition, active regions can include one or more quantum well layers, and each of the diodes 410, 420, 430 can have different active regions. Spacer or cladding layers can also vary.

Figure 5:
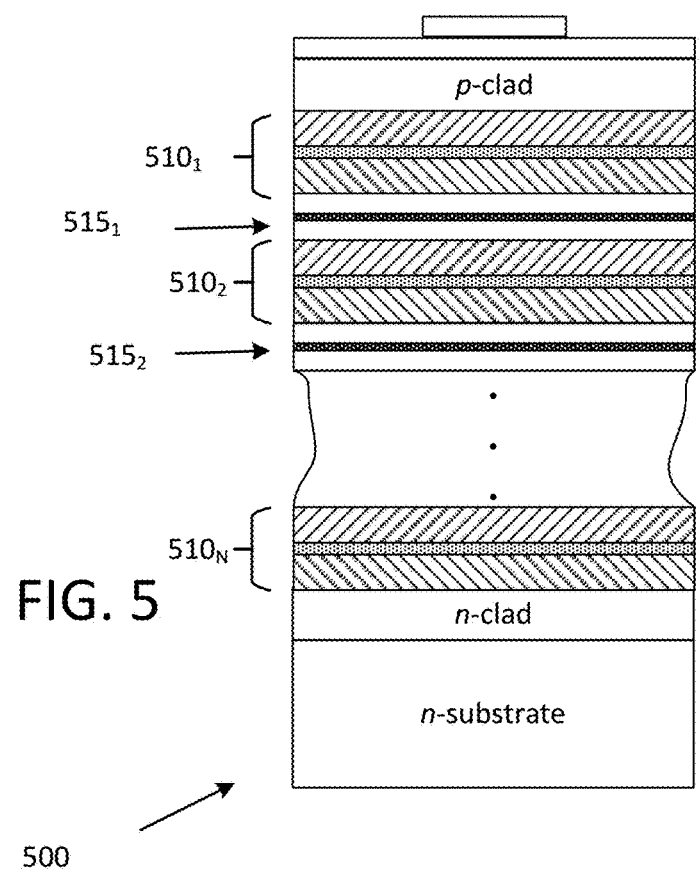
FIG. 5 illustrates an epitaxial layer stack associated with a coherent multi-junction laser diode.

FIG. 5 illustrates a coherent multi-emitter laser diode 500 that includes laser diodes $510_1, 510_2, \ldots 510_N$ that are separated by tunnel junctions $515_1, 515_2, \ldots 515_{N-1}$, wherein N is a positive integer. The laser diodes 510 can all be the same or different, and can be separated by tunnel junctions 515 of the same or different layer compositions, thicknesses or dopings.

Antisymmetric Coherent Double Junction Laser Diode

Figure 6:
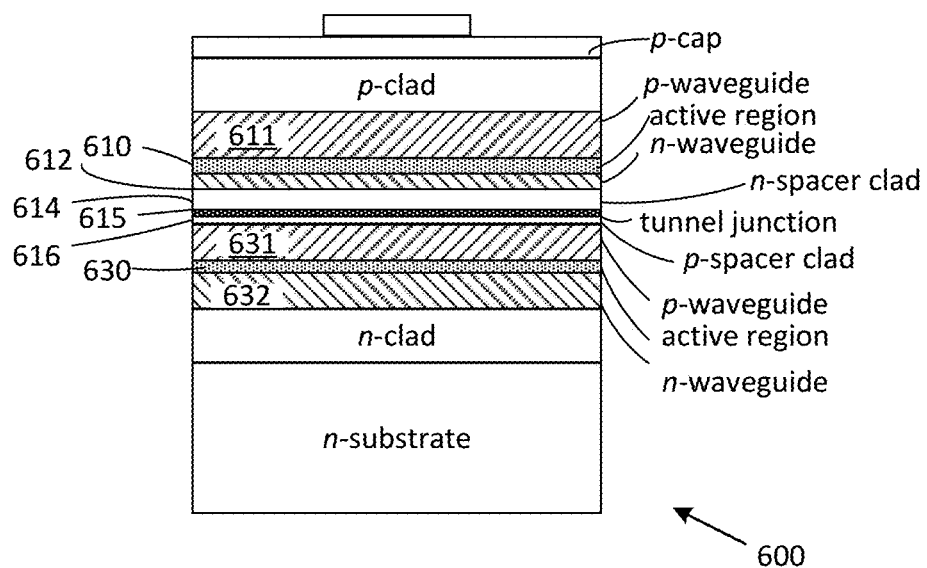
FIG. 6 illustrates an epitaxial layer stack associated with an asymmetric coherent double junction laser diode.

Referring to FIG. 6, a representative coherent double junction laser diode 600 includes a first active region 610 and a second active region 630. The first active region 610 is situated between an outer p-waveguide layer 611 and an inner n-waveguide layer 612 that is thinner than the outer p-waveguide layer 611; the second active region 630 is situated between an inner p-waveguide layer 631 and an outer n-waveguide layer 632 having substantially the same thickness. In other examples, the inner p-waveguide layer 631 is thinner than the outer n-waveguide layer 632. Generally, layer thicknesses are independently selected to provide optical coupling. The second active region 630 and the first active region 610 are separated by an n-spacer clad layer 614, a tunnel junction 615, and a p-spacer clad layer 616. In the example of FIG. 6, the p-spacer clad layer 616 is thinner than the n-spacer clad layer 614. Some or all layer thicknesses can be adjusted as preferred, and FIG. 6 illustrates only one example.

Phase Compensation

Figure 7:
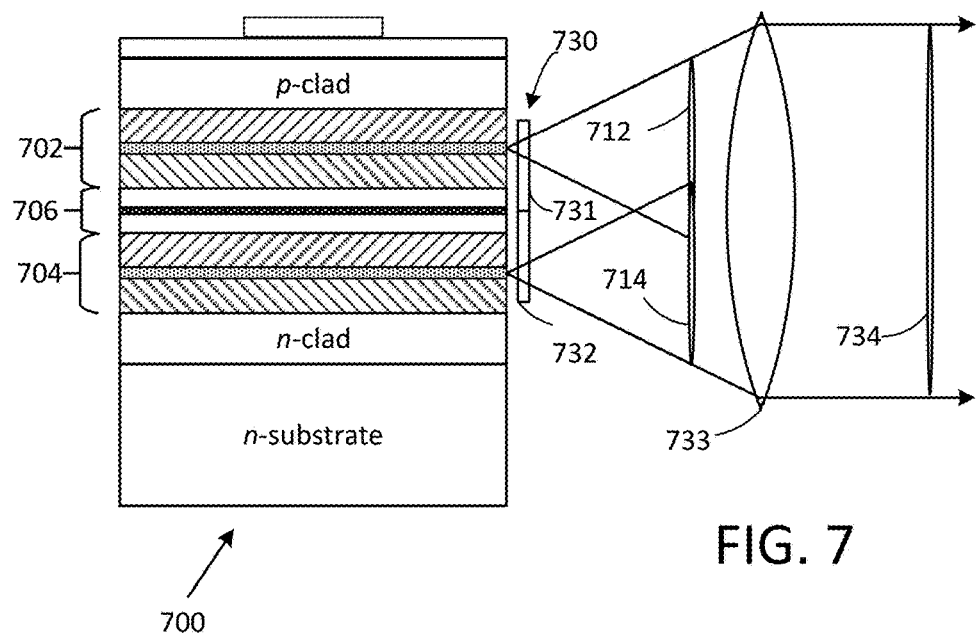
FIG. 7 illustrates a phase mask situated to produce a symmetric beam mode from an antisymmetric beam mode.

Coherent multi-junction laser diodes typically produce optical output beams that have one or more intensity minima within a beam profile. These minima result from optical losses associated with tunnel junctions that couple active regions of the laser diodes as these losses tend to discriminate against a lowest order mode. In addition, intensity lobes associated with higher order modes are also associated with phase differences. Such phase differences can be compensated with phase compensators external to the laser diodes so as to reduce or remove destructive interference and result in reduce beam divergence. The phase compensators can be placed either in the near-field zone or the far-field zone or in an intermediate area. For example, an antisymmetric mode having a central minima can be modified to increase beam brightness to levels that approach the brightnesses that would be achievable with a symmetric, lowest order mode. Referring to FIG. 7, a coherent multi-junction laser diode 700 includes a first laser diode 702 and a second laser diode 704 that are separated by a tunnel junction and cladding layers 706. The first laser diode 702 and the second laser diode 704 produce respective beams 712, 714 that are directed through a phase mask 730 to a collimation lens 733 to produce a combined beam 734. The phase mask 730 includes a first section 731 and a second section 732 that are arranged to introduce an additional 180 degree phase shift between the beams 712, 714. In FIG. 7, the phase mask 730 is situated adjacent or near emitting facets and thus can be referred to as being in near field; in other examples, a phase mask can be placed at another location such as in the far field.

Figure 8B:
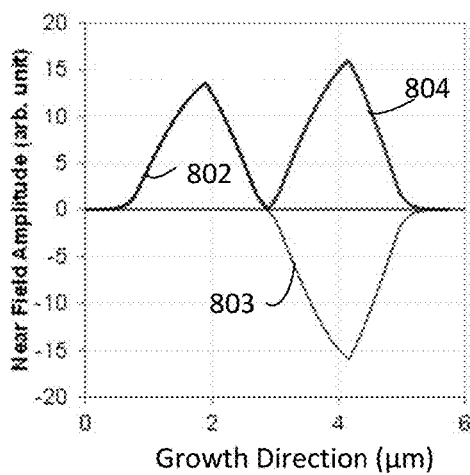
FIGS. 8A-8B illustrate near field amplitude as a function of position and far field amplitude as a function of angle for coherent double beam modes before and after processing by a phase mask.
Figure 8A:
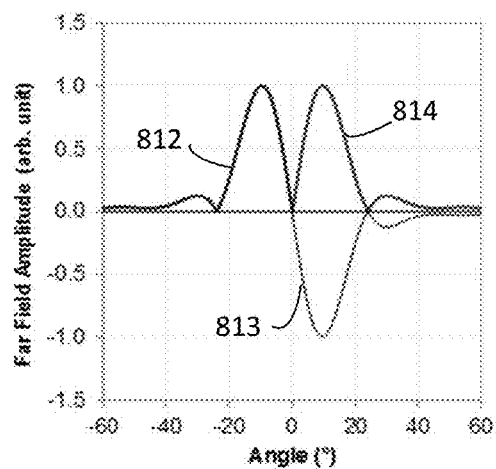

With a phase mask as illustrated in FIG. 7, an out-of-phase antisymmetric mode can be transformed into an in-phase symmetric mode. Referring to FIG. 8A, near field beam amplitude is plotted as a function growth direction. A beam propagating in an out-of-phase antisymmetric mode includes a first beam portion 802 and a second beam portion 803 that are out-of-phase. After phase compensation, the beam propagates in an in-phase symmetric mode that includes a first beam portion such as the uncompensated first beam portion 802 and a second beam portion 804 that corresponds to the second beam portion 803 of the antisymmetric mode but with a change in the sign of the amplitude, i.e., with a 180 degree phase change. This phase compensation reduces fast axis beam divergence roughly by half, close to that of the symmetric coherent mode as shown in FIG. 3A, without changes to near field beam size or shape. Thus, a preferred antisymmetric coherent mode can be produced, avoiding tunnel junction losses, while still provide powers and brightnesses comparable to those available in a symmetric coherent mode.

In the example discussed with reference to FIG. 8B, phase compensation is applied at or near the facets of the coherent double junction laser diode. Phase compensation can also be provide by situating a phase plate in a beam far field. Referring to FIG. 8A, far-field beam amplitude is plotted as a function of angle. A beam propagating in an out-of-phase antisymmetric mode includes a first beam portion 812 and a second beam portion 813 that are out-of-phase. After phase compensation, the beam propagates in an in-phase symmetric mode that includes a first beam portion such as the uncompensated first beam portion 812 and a second beam portion 814 that corresponds to the second beam portion 803 of the antisymmetric mode but with a change in the sign of the amplitude, i.e., with a 180 degree phase change.

Figure 9:
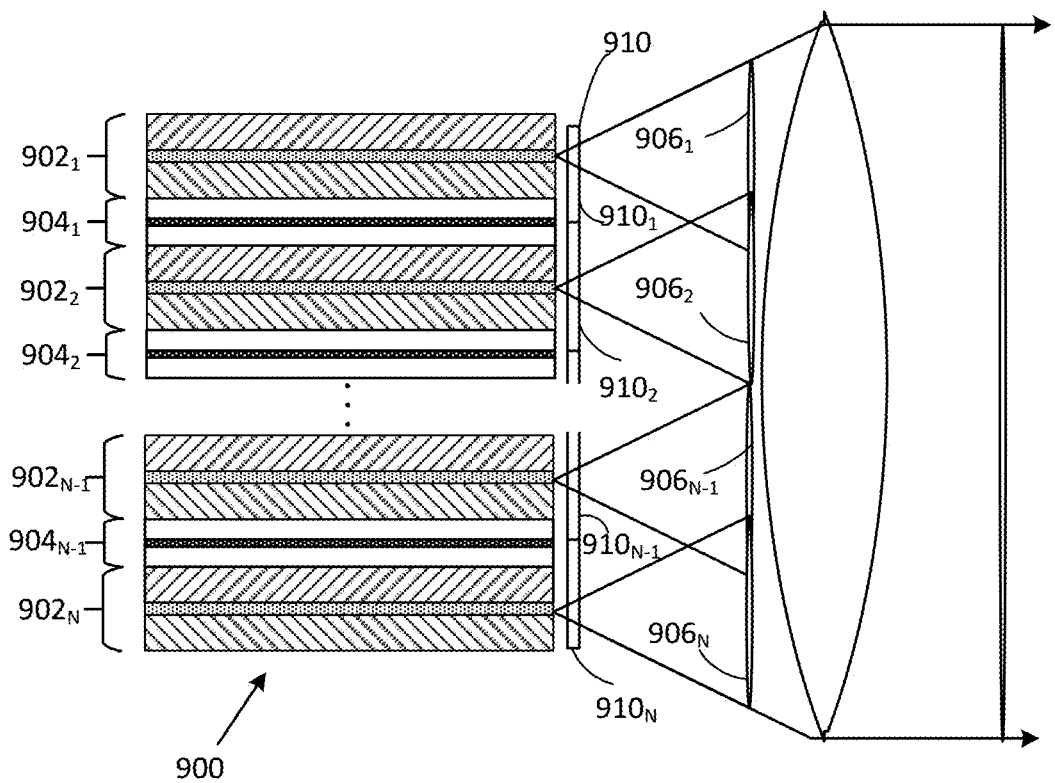
FIG. 9 illustrates a phase mask situated to produce phase differences between a plurality of coherent beam modes.
Figure 12A:
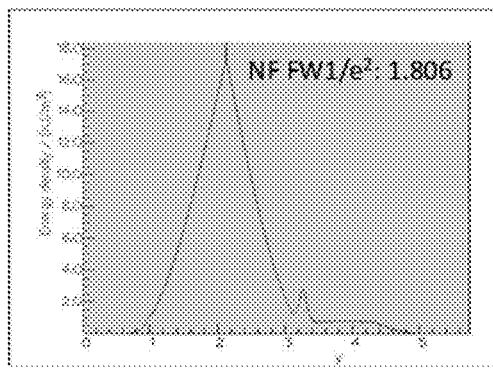
FIGS. 12A-12B and 12C-12D illustrate near field intensities and far field intensities associated with symmetric and antisymmetric beam modes, respectively, produced by a double junction 885-nm diode laser similar to that of FIG. 2A with a ratio of waveguide layer thickness of 1.6 in contrast to the 1:1 ratio of the FIG. 2A configuration.
Figure 12B:
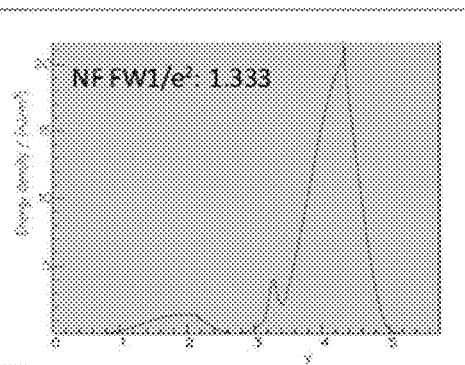
Figure 12C:
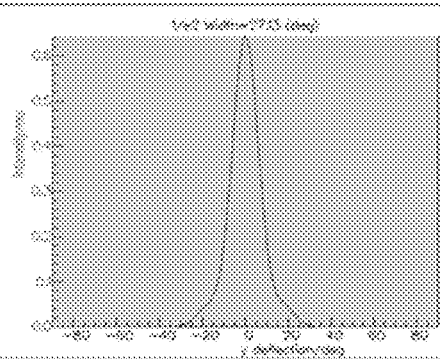
Figure 12D:
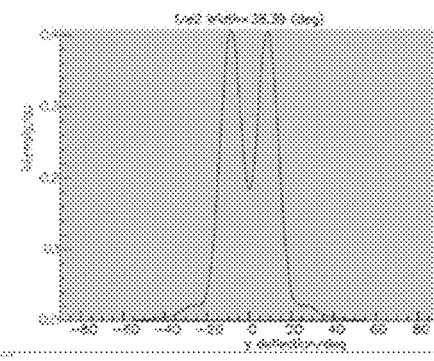

The method can be applied to multi-junction diode lasers of N junctions, with N≥2. As shown in FIG. 9, laser diodes $902_1, 902_2, \ldots 902_N$ that are separated by tunnel junctions $904_1, 904_2, \ldots 904_{N-1}$ produce beams $906_1, 906_2, \ldots 906_N$, respectively. A phase mask 910 is situated to provide a selected phase to each of the beams $906_1, 906_2, \ldots 906_N$ with respective mask segments $910_1, 910_2, \ldots 910_N$. In such a configuration, an output beam brightness that is N times a single emitter brightness can be obtained, for N emitters that produce a common output power. In the above examples, a phase mask is situated in the near field region of the optical beams, but phase masks can also be situated if preferred in far field regions.

Modeled Thickness and Refractive Index Contrast

Coherent coupling between lasing modes of different junctions in multi-junction diode lasers can increase output beam brightness. Design parameters for such multi-junction laser diodes include waveguide optical thickness associated with each active region, spacer-cladding optical thickness between active regions, and index differences between waveguide and spacer-cladding layers. As an example, in an 885-nm double junction design described with reference to FIGS. 2A-3B, a symmetric coherent mode has a near field beam width ($e^{-2}$) of 3.57 μm and far field full width ($e^{-2}$) of 18.3 degrees, thus having a beam parameter product BPP=0.283 mm-mrad. Lasing in an SCM can be achieved either through gain and waveguide selection to improve modal discrimination over ASM modes, or through external-cavity phase modulation of ACMs. In either case, coherence can be maintained by coupling between lasing modes of the two laser junctions, and by preferably lasing in one single mode (either the symmetric or the antisymmetric mode, but not both).

The effect of varying (increased) spacer layer thickness is shown in FIGS. 10A-10D in which modeled near field and far field intensities of symmetric and antisymmetric modes in a coherent double junction 885-nm diode laser design with doubled spacer layer thickness compared to that of the FIG. 2A configuration (~0.8 μm thick) are plotted. The symmetric and antisymmetric modes are almost completely separated in the two laser junctions, respectively, due to the thicker spacer-cladding in between. Effectively, the coherent coupling between the modes of the two laser junctions is nearly lost, and the modes are now close to those in two incoherent laser junctions. There is very little modal discrimination between the two, so that both modes will lase incoherently with relatively equal strength. The near field is therefore similar to that in FIG. 3, but the far field divergence is more than doubled (BPP~0.7 mm-mrad, also more than doubled).

The effect of increasing a refractive index difference between waveguide and spacer-cladding layers is shown in FIGS. 11A-11D in which modeled near field and far field intensities of symmetric and antisymmetric modes in a coherent double junction 885-nm diode laser design with doubled refractive index difference (i.e., $\Delta n$~0.35) as compared to the FIG. 2A configuration are plotted. Coherent coupling between the modes is nearly completely lost, and the modes are close to those produced by two incoherent laser junctions, leading to a larger BPP of ~0.7 mm-mrad.

In another example, the relative thickness of waveguide layers can be varied, with resulting near field and far field intensity variation as shown in FIGS. 12A-12D. Specifically, a double junction 885-nm diode laser can have a thickness ratio of 1.6:1 between the waveguide layers. Similar incoherent lasing of the two modes, as well as larger BPP, are expected. Note that the imbalance in waveguide thicknesses, hence decoherence, can be unintentional. For example, the buried junction of a diode laser general runs hotter because it is further away from the heatsink, so that its optical thickness is larger. The thickness of the buried junction can be selected to compensate this decoherence effect. Thus, in coherent multi-emitters, one or more of the multi-emitters can be configured to provide thermal compensation to remain sufficiently balanced during operation.

Double Heterostructure Devices

Figure 13:
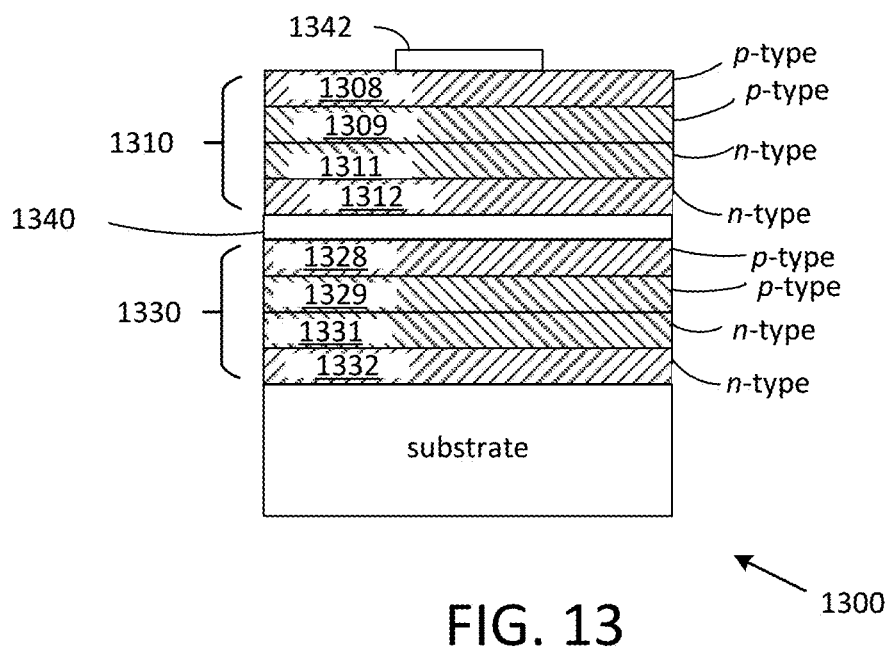
FIG. 13 illustrates a representative coherent double emitter based on double heterostructure laser diodes.

In another example, coherent multi-emitter laser diodes are formed as double-heterostructure devices, without quantum wells. As shown in FIG. 13, a coherent multi-emitter laser diode 1300 includes a first laser diode 1310 and a second laser diode 1330 that are formed by respective layers 1308-1309, 1311-1312, and 1328-1329, 1331-1332. The laser diodes 1310, 1330 can be separated by an n-spacer clad layer, a tunnel junction, and a p-spacer clad layer, and a top contact 1342 can be situated adjacent the first laser diode 1310.

Combined Beam Systems

Figure 14A:
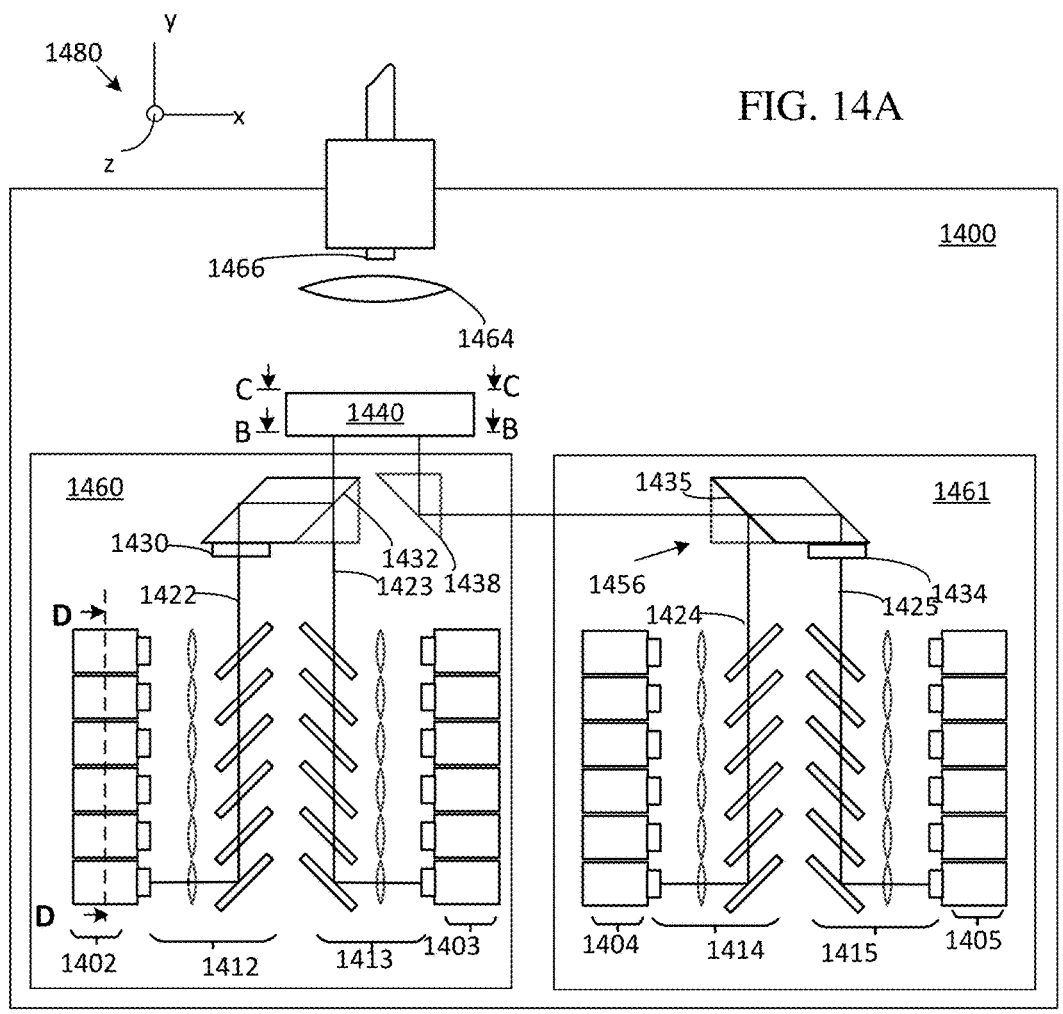
FIG. 14A illustrates a laser diode assembly in which two beam stacks based on coherent multi-junction emitters are formed using polarization multiplexing, and the two beam stacks compressed using a beam compressor.
Figure 14D:
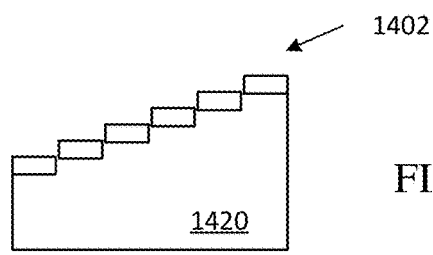
FIG. 14D illustrates a representative stair-step laser diode mount.

Beams from a plurality of coherent multi-emitter laser diodes can be combined in various ways. With reference to FIGS. 14A-14D, a diode laser assembly 1400 is described with reference to a right-handed xyz coordinate system 1480 in which a z-axis extends upwardly out of the plane of FIG. 14A. The diode laser assembly 1400 includes sets of coherent multi-emitter laser diodes 1402-1405 that are arranged to emit respective sets of laser beams to corresponding phase masks, reflectors and fast and slow axis collimators 1412-1415. For example, the laser diodes of the set 1402 emit beams along an x-axis direction that are then redirected by respective reflectors of the set 1412 so as to propagate along a y-axis direction. In some examples, phase masks are not used, and coherent beams from multi-junction devices are used without additional phase compensation. The laser diodes of each set are displaced or offset from other laser diodes of the same set along a z-axis and the associated reflectors situated so that laser beams from the set are not blocked by the reflectors. As shown in FIG. 14D, the set of laser diodes 1402 is secured to a stepped mount 1420 to provide suitable z-axis offsets; similar mounts are provided for the remaining sets of laser diodes. For convenience, beam propagation axes 1422-1425 are shown for the bottom-most laser diodes of each set; beam propagation axes for the remaining laser diodes of each set are similar, but displaced along the z-axis.

The laser beams from the set of laser diodes 1402 are directed to a half-wave retarder 1430 and then combined with the laser beams from the set of laser diodes 1403 at a polarizing beam splitter 1432 so that a vertically stacked set of beams 1436A (shown in FIG. 14B) is incident to a beam spacing compressor 1440 that can be provided as a pair of cylindrical lenses. The laser beams from the set of laser diodes 1405 are directed by reflectors of the set 1415 to a to a half-wave retarder 1434 and then combined with the laser beams from the set of laser diodes 1404 as redirected by reflectors of the set 1414 at a polarizing beam splitter 1435 so that a vertically stacked set of beams 1436A is incident to the beam compressor 1440.

FIG. 14B illustrates the stacked beams 1436A, 1436B as incident to the beam compressor 1440; FIG. 14C illustrates stacked beams 1456A, 1456B exiting the beam compressor 1440, wherein both beam spacing and individual beam height are altered by a compression ratio M=H2/H1. In this example, a cylindrical lens based beam compressor is used and there is compression in a z-direction but not in an x-direction. Additional compressors can be provided for compression in other directions, or a compressor using spherical surfaces can be used.

Figure 15:
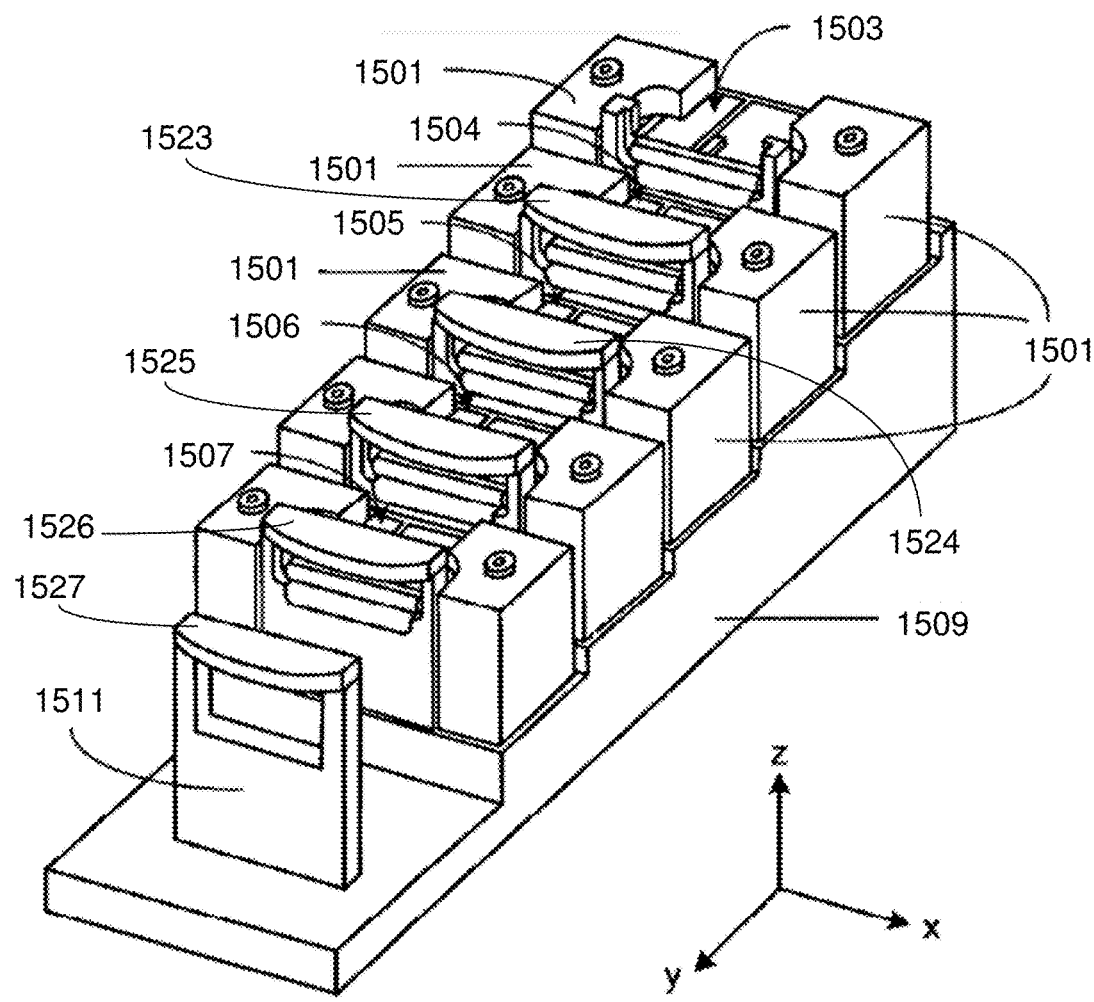
FIG. 15 illustrates a representative assembly for directing collimated beams from a plurality of coherent multi-junction emitters along parallel axes.

In other examples, coherent multi-junction emitters can be arranged in a vertical stack along a single axis. Referring to FIG. 15, a coherent laser diode subassemblies 1503-1507 are secured by clamps 1501 to a stepped base 1509. Typically, each of the coherent laser diode subassemblies 1503-1507 includes a phase mask to control beam divergence and a fast axis lens, both of which are generally situated at or near an output facet. Slow axis lenses 1523-1526 are situated at the clamps 1501 so as to be fixed with respect to the stepped base 1509; slow axis lens 1527 is fixed to an additional lens mount 1511 that is also secured to the stepped base 1509. When activated, coherent laser diodes produce respective optical beams that are directed along a y-axis but are displaced along a z-axis. The beams can be combined and directed to a target such as a pump input to a fiber laser system.

Multi-Emitter Fabrication and Design

Figure 16:
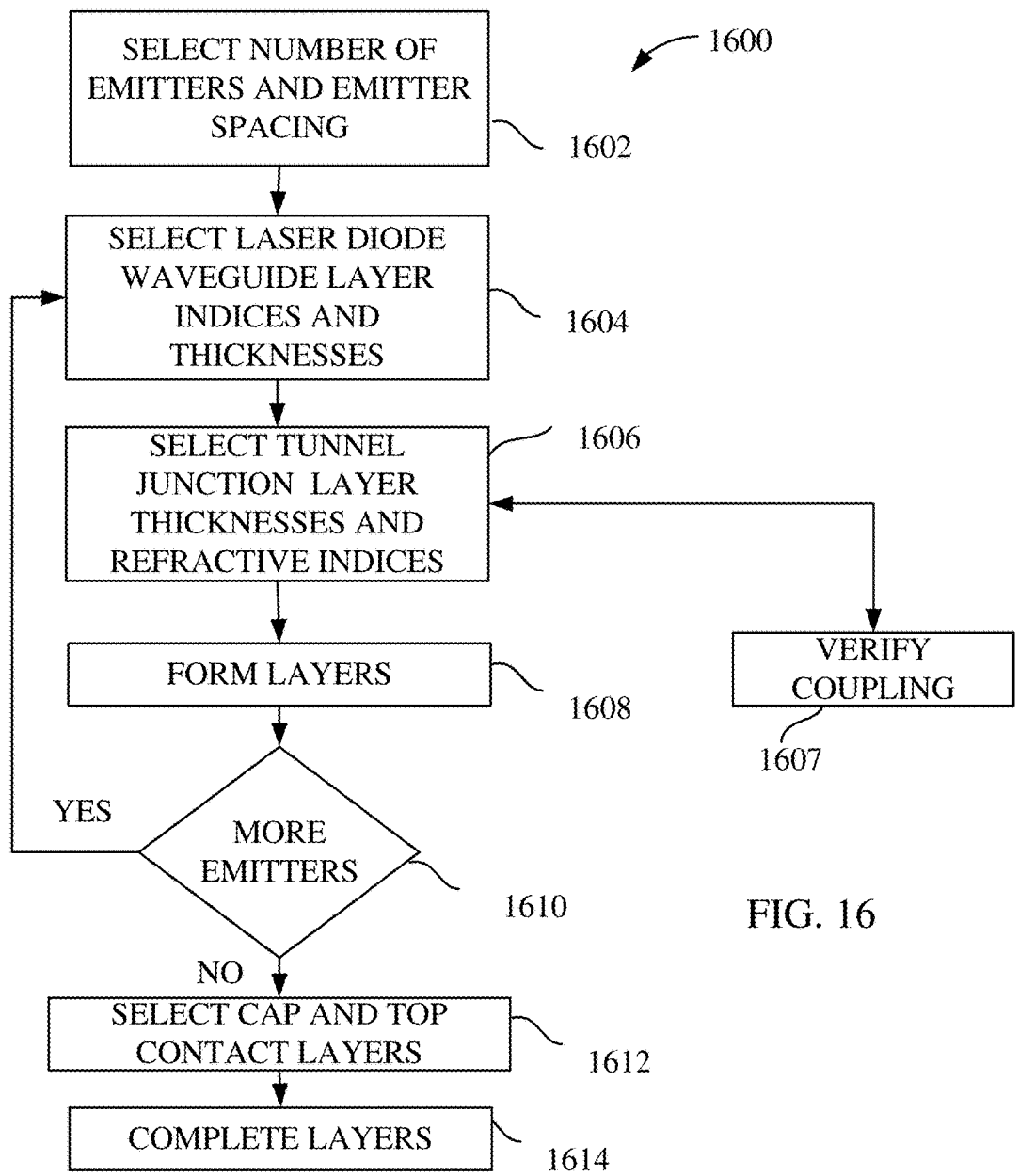
FIG. 16 illustrates a representative method of designing and fabricating coherent multi-emitter laser diodes.

Referring to FIG. 16, a representative method 1600 includes selecting a number of emitter and emitter spacings at 1602. In some cases, emitters are uniformly spaced, while in others, distances to adjacent emitters are different for each emitter. At 1604, laser waveguide layer indices of refraction and thicknesses are selected. For quantum well lasers, at 1606, tunnel junction layer thickness and refractive indices are selected. At 1607, the selected refractive indices, thicknesses, and spacings can be evaluated to verify that coherent coupling is available. The layers are formed at 1608, by, for example, epitaxial growth or other processes. At 1610, it is determined if addition emitters are to be fabricated, and, if so, processing returns to the selection processes 1604, 1606. If not, cap and top contact layers are selected at 1612, and formed at 1614. Because quantum well thickness is small, it generally does not degrade coherent coupling, and can be selected and formed as required with little to no effect on coherent coupling.

Single Waveguide Coherent Double Emitters

With reference to FIG. 17A, a single waveguide coherent double emitter laser diode 1700 includes laser diodes 1710, 1730 that are separated by and electrically coupled by a tunnel junction 1720 and situated on a substrate. The laser diode 1710 includes an outer waveguide layer 1708, an active region 1711, and an inner waveguide layer 1712 that can contact the tunnel junction 1720. The laser diode 1730 includes an outer waveguide layer 1732, an active region 1731, and an inner waveguide layer 1728 that can contact the tunnel junction 1720. A p-clad layer 1706 is adjacent the outer waveguide layer 1708, and electrical contact is provided through a p-cap layer 1702 and a top contact 1701. In contrast to the design of FIG. 2A, no cladding layers at the tunnel junction are provided and a single waveguide is formed.

Refractive index as a function of position is graphed in FIG. 17B showing that a substantially constant refractive index is provided between the p-clad layer 1706 and an n-clad layer 1733. FIGS. 18A-18B show modeled fast axis near field and far field intensities of the symmetric and antisymmetric modes in an 885-nm coherent single-waveguide double-junction diode laser. These two modes correspond to the 0th and the 1st order mode of the combined waveguide (for simplicity, the tunnel junction is assumed to have the same index of refraction as the waveguide). While the near field of the fundamental (symmetric) mode is significantly different from the two-waveguide design, i.e., there are not two lobes in the near field, the antisymmetric mode (both near and far field) looks essentially the same. One advantage of the single waveguide design is the elimination of voltage defects at the heterojunction interfaces from the inner cladding in two-waveguide designs. However, the voltage defect in the two-waveguide designs can also be mitigated by choosing inner cladding materials with less band offset with the waveguide material than that of the outer cladding materials.

Miscellaneous Examples

Antisymmetric coherent double junction diode lasers are disclosed that can achieve stable coherent coupling in the fast axis, as well as maintain high power and high efficiency operation previously demonstrated in incoherent double junction diodes. Optical waveguide design and bandgap engineering is used to simultaneously achieve a) strong coherent coupling between the optical modes in the multiple junctions, b) antisymmetric (out-of-phase) coherent modes that have minimum field strength at the TJs for minimum intrinsic loss in the laser cavity, and c) large optical cavity designs with high power and high efficiency performance. In some examples, TJs are configured to lower optical losses and low electrical series resistance associated with the TJs, by selecting doping concentration, materials, dopants, and layer thicknesses in the TJs. Although not illustrated in the figures, ridge waveguide coherent multi-emitters can be provided, and such devices generally exhibit the same multiple modes in the slow axis as with single emitters or incoherent multi-emitters of the same emitter width.

Figure 19A:
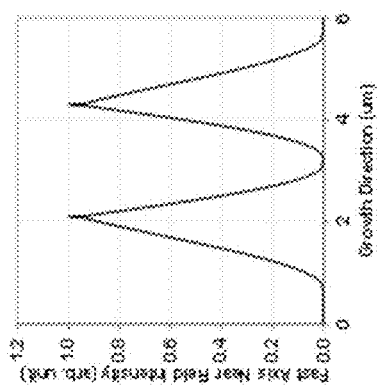
FIGS. 19A-19B illustrate measured fast axis far field intensity for a representative 980-nm coherent double junction diode laser as fabricated.
Figure 19B:
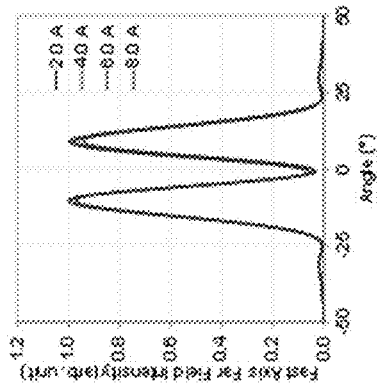
Figure 19C:
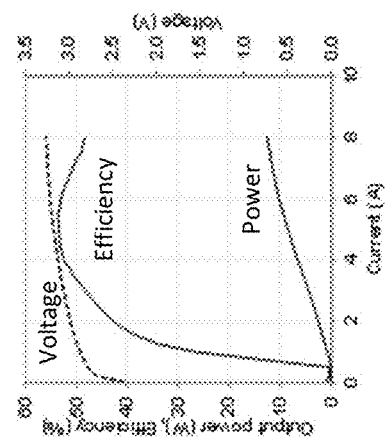
FIG. 19C illustrates measured output power, efficiency, and voltage as a function of drive current for a representative coherent 980-nm double junction diode fabricated with a stripe width of 95 μm and a cavity length of 3.8 mm.
Figure 20:
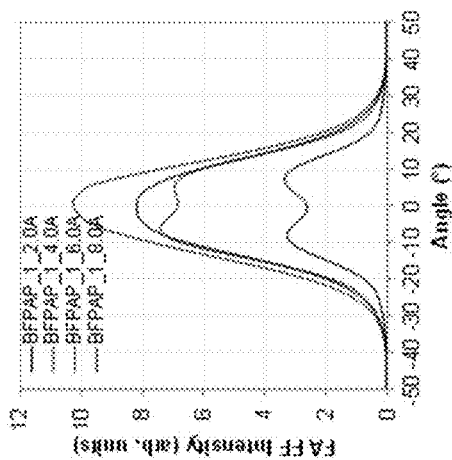
FIG. 20 illustrates measured fast axis far field intensity at various drive currents in a second 980-nm double junction diode laser as fabricated having a refractive index contrast that is about 0.06 greater than that used in FIGS. 19A-19C, showing significant loss of coherence between the two junctions.

FIGS. 19A-19C illustrate the measured performance of a representative 980-nm coherent double junction diode laser fabricated based on single emitter laser diodes having a stripe width of 95 µm (slow axis width) and a cavity length of 3.8 mm. As shown in FIG. 19A, the modeled near field is shown to have a width of about 4.12 µm, compared to the width of 1.63 µm in the single junction design. The measured far field intensity (FIG. 19B) has a divergence angle of 38.4° as opposed to 47.4° for a single junction (not shown). Fast axis beam parameter products (BPPs) of the coherent double junction and single junction 980-nm diode laser are therefore 0.68 and 0.33 mm-mrad, respectively. The BPP in the antisymmetric coherent double junction, although two times higher than that in the single junction, is a significant improvement over incoherent double junction emitters, and can be reduced by half through external phase modulation. With two times the power, the brightness of the coherent double junction emitters doubles that of the single junction diodes. As shown in FIG. 19C, measured output power, efficiency and voltage are plotted vs. drive current for the 980-nm coherent double junction diode laser fabricated. FIG. 20 shows measured fast axis far field intensity for another 980-nm coherent double junction diode laser as fabricated. Index contrast between the waveguide and spacer-cladding is ~0.06 higher than that of the configuration used in the coherent double junction diode lasers in FIGS. 19A-19C. It is apparent in FIG. 20 that such index contrast leads to almost complete loss of coherence between the modes of the laser junctions, so that the measured fast axis divergence is similar to that of a single laser junction.

Symmetric Mode Coupling

As discussed above, optical beams from coherent double-junction diode lasers (or multi-junction laser diodes generally) can be combined to produce higher output powers using, for example, polarization and wavelength multiplexing. In addition, displaced beams for such diode lasers can be combined. For coherent double junction laser diodes, it is convenient to describe beam combining with reference to the symmetric and the antisymmetric modes.

Fast axis near field and far field intensities of a symmetric mode optical beam from a coherent double junction 976-nm diode laser are shown in FIGS. 21A-21B. With a symmetric mode beam, it is convenient to provide a single fast axis collimation lens (FAC) that receives beams from both of the laser diode facets of the coherent double junction laser diode. In addition, a single slow axis collimator (SAC) can be provided for each such laser diode for collimations in a lateral (slow axis) direction as well. A single turning mirror can be used to direct the coherently combined beam to fiber-coupling optics. Because of the doubled power produced by coherent double junction laser diodes with the same far field beam spread as compared to single junction devices, half as many laser diodes and associated optical components can be used to achieve the same power with substantially the same BPP is roughly the same as the incoherent devices of the same junction thickness with brightness that is twice that of incoherent devices. In some cases, optical power suitable for a particular application can be obtained with half as many devices, and/or without wavelength or polarization multiplexing. As an example, a one row by six coherent double junction laser diode assembly (a 1 by 6 configuration) produces substantially the same power as a two row by six conventional laser diode assembly (a 2 by 6 configuration). Note that FIG. 22 shows a 1 by 6 arrangement 2200 of coherent double-junction laser diodes (CDJLDs).

Antisymmetric Mode Coupling with a 180 Degree Phase Plate

Figure 23A:
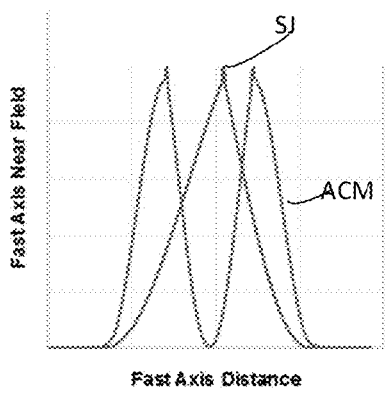
FIGS. 23A-23B are graphs representing fast axis near field intensity and fast axis far field intensity of a symmetric double junction 976-nm diode laser as functions of near field position and far field angle along the fast axis. For comparison, near field and far field intensities for a conventional single junction diode laser with the same junction thickness are also shown.
Figure 23B:
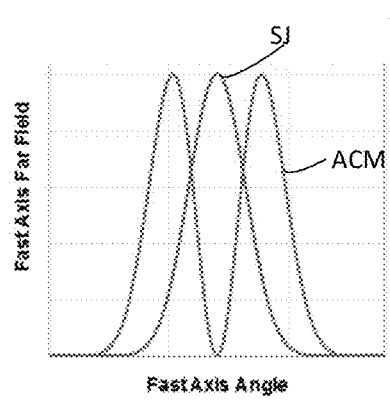

A representative example of fast axis near field intensity and far field intensity of an antisymmetric mode double junction 976-nm diode laser are shown in FIGS. 23A-23B as functions of near field position and far field angle along a fast axis. While the fast axis near field is of similar width, the fast axis far field of the antisymmetric mode is smaller than but close to twice that of the incoherent single junction device. However, if one half of the beam is allowed to transit a pi-phase shifter so that the beam is in phase, the far field reduces to that of the symmetric mode shown on the right of FIG. 2. This can be done either by inserting a phase plate over one half of the beam or by implementing the phase shift in the FAC lens that overlaps one half of the beam. This monolithic phase-shifter can be achieved either by selective deposition of an optical thickness for one half of the beam or selective etching of required thickness for it-phase shift. The rest of the optical system is can be the same as for the symmetric mode.

Antisymmetric Mode without Phase Shifter

In this case, the fast axis far field of the antisymmetric mode is smaller than but close to twice that of the incoherent single junction device, which leads to smaller than but close to twice the BPP. Because of doubled power in the double junction, the brightness of the device is equal to or slightly higher than a conventional laser diode. Even though the fast axis BPP is higher, a reduced count of diode lasers with antisymmetric mode can be stacked in the fast axis, so that the overall fast axis BPP is roughly the same as an array of conventional laser diodes.

Phase Plates and Other Phase Shifters

Figures 24, 25, 26:
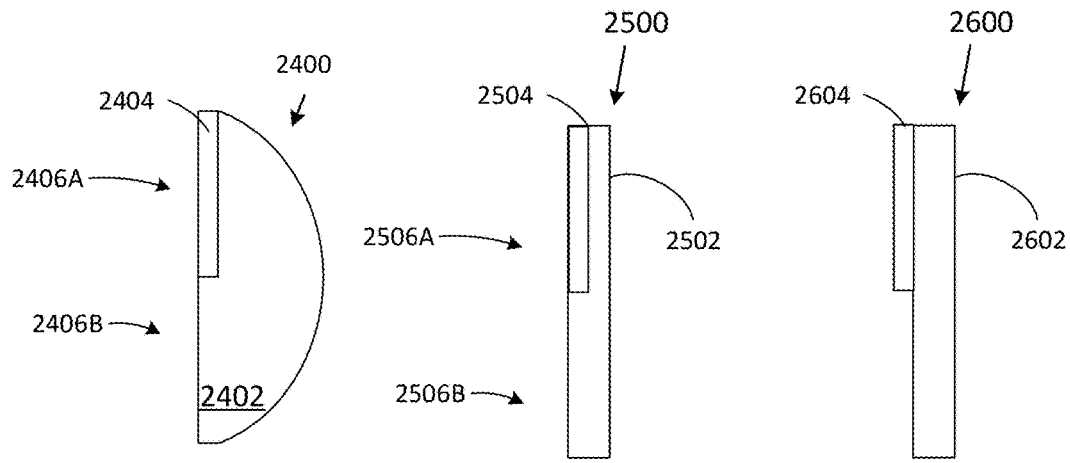
FIG. 24 illustrates a representative fast axis lens that includes a phase shifting portion.
FIG. 25 illustrates a representative phase plate.
FIG. 26 illustrates a representative phase plate.
Figure 27:
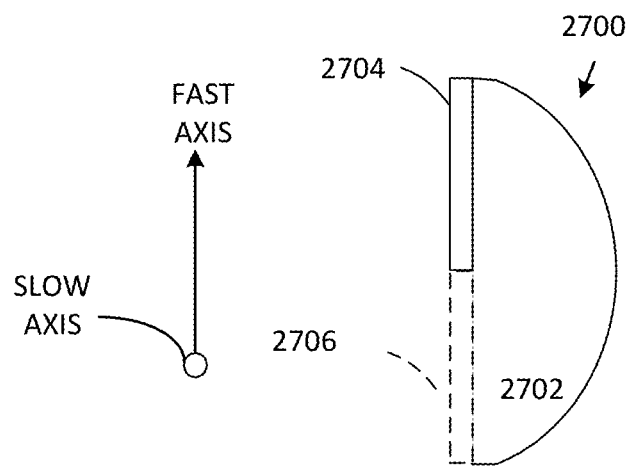
FIG. 27 illustrates a representative fast axis lens that includes a phase shifting portion.

Referring to FIG. 24, a fast axis lens (or other lens element) 2400 includes a lens body 2402 and a recessed area 2404. The recessed area 2404 can have a depth sufficient to provide a π phase difference for beams transmitted through an upper portion 2406A and a lower portion 2406B. In some examples, the recessed area is filled with a material having different refractive index that the lens body 2402 so as to produce the selected phase difference. In other examples, the recessed area is formed by etching. In another example shown in FIG. 27, a lens 2700 includes a lens body 2702 and a phase shift layer 2704. The phase shift layer 2704 can be formed by, for example, electron beam evaporation or other processes. Alternatively, an additional phase shift layer 2706 can be provided and refractive indices selected so that a phase difference between the phase shift layers 2704, 2706 is π. In some cases, the phase shift layers 2704, 2706 have a common thickness, and the phase difference can be selected by thinning one or both of the phase shift layers 2704, 2706. In the example of FIG. 27, the lens 2700 is illustrated as a fast-axis collimator to be situated in a near field, and is typically a cylindrical lens. It should be noted that phase shift layers and recesses can be provided on any lens surface such as curved or planar surfaces of the lenses 2400, 2700.

Figure 29:
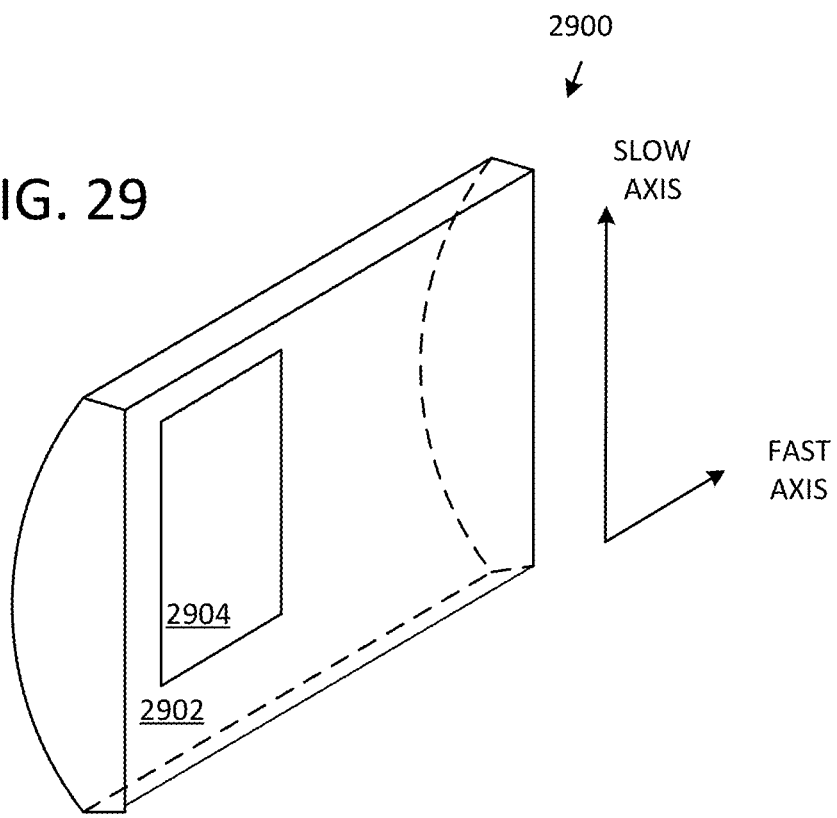
FIG. 29 illustrates a representative slow axis lens that includes a phase shifting portion.

Referring to FIG. 29, a lens 2900 includes a lens body 2902 and a phase shift area 2904 situated on the lens body. The phase shift area 2904 can be formed by deposition of additional material, etching, or other processes and can be situated on either surface of the lens body 2902 as is convenient. In the example of FIG. 29, the lens 2900 is illustrated a slow axis collimator with respect to the illustrated fast and slow axes.

Figure 28:
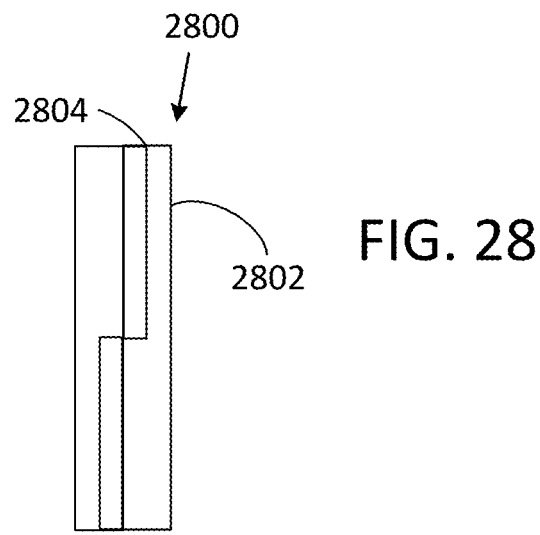
FIG. 28 illustrates a representative phase plate.

Referring to FIG. 25 a phase plate 2500 includes a body 2502 and a recessed area 2504. The recessed area 2504 can have a depth sufficient to provide a π phase difference for beams transmitted through an upper portion 2506A and a lower portion 2506B. In some examples, the recessed area is filled with a material having different refractive index than the body 2502 so as to produce the selected phase difference. In another example shown in FIG. 26, a phase plate 2600 includes a body 2602 and a phase shift layer 2604 situated on the body 2602. The phase shift layer 2604 can be formed by, for example, electron beam evaporation or other processes. As shown in FIG. 28, two phase plates 2802, 2804 such as those discussed above can be situated with respect to each other so as to produce a suitable phase difference.

Phase shifters can be made of optical glasses, plastics, or other transmissive materials based on an intended application and wavelength of interest. In still other examples, reflective phase shift devices can be used, but transmissive devices tend to be more convenient.

While the disclosed technology has been described with reference to numerous examples, these examples are illustrative and are not to be taken as limiting the scope of the disclosure. We claim all that is encompassed by the appended claims.

We claim:

1. A multi-emitter laser diode, comprising:
   a first active region associated with a lasing wavelength situated between an inner waveguide layer and an outer waveguide layer;
   a second active region associated with the lasing wavelength situated between an inner waveguide layer and an outer waveguide layer, wherein the inner waveguide layer of the first active region and the inner waveguide layer of the second active region are situated between the first active region and the second active region, and the first active region and the second active region are situated so that an optical beam propagating in the first active region is optically coupled to the second active region; and
   a phase mask situated with respect to the first active region and the second active region to produce a 180 degree phase shift between optical beams from the first active region and the second active region to produce a symmetric mode from an asymmetric mode.

2. The multi-emitter laser diode of claim 1, wherein at least one of the inner waveguide layers associated with the first and second active regions has a thickness such that the first active region and the second active region are optically coupled.

3. The multi-emitter laser diode of claim 1, wherein the inner waveguide layers associated with the first and second active regions have thicknesses such that the first active region and the second active region are optically coupled.

4. The multi-emitter laser diode of claim 1, wherein the inner waveguides associated with the first and second active regions have a common thickness.

5. The multi-emitter laser diode of claim 1, wherein the inner waveguides associated with the first and second active regions have a combined thickness of less than four times the lasing wavelength.

6. The multi-emitter laser diode of claim 5, wherein the inner waveguides associated with the first and second active regions have a combined thickness of less than the lasing wavelength.

7. The multi-emitter laser diode of claim 5, wherein the inner waveguides associated with the first and second active regions have a combined thickness of less than one-half of the lasing wavelength.

8. The multi-emitter laser diode of claim 5, wherein the inner waveguides associated with the first and second active regions have a combined thickness of less than one-tenth of the lasing wavelength.

9. The multi-emitter laser diode of claim 1, wherein a separation of the first active region and the second active region is less than four times the lasing wavelength.

10. The multi-emitter laser diode of claim 9, wherein the separation the first active region and the second active region is less than the lasing wavelength.

11. The multi-emitter laser diode of claim 1, further comprising a tunnel junction situated between the inner waveguide layer associated with the first active region and the inner waveguide layer associated with the second active region, the tunnel junction situated between a first spacer layer and a second spacer layer situated at the inner waveguide layers associated with the first active region and the second active region, respectively.

12. The multi-emitter laser diode of claim 11, wherein a refractive index difference between at least one of the inner waveguide layer associated with the first active region and the first spacer layer and the inner waveguide layer associated with the second active region and the second first spacer layer is less than 0.5.

13. The multi-emitter laser diode of claim 12, wherein a refractive index difference between the inner waveguide layer associated with the first active region and the first spacer layer and the inner waveguide layer associated with the second active region and the second first spacer layer is less than 0.3.

14. The multi-emitter laser diode of claim 11, wherein a refractive index difference between the inner waveguide layer associated with the first active region and the first spacer layer is less than 0.2 and a refractive index difference between the inner waveguide layer associated with the second active region and the second first spacer layer is less than 0.3.

15. The multi-emitter laser diode of claim 11, wherein the first spacer layer and the second spacer layer have a total thickness that is less than four times the lasing wavelength.

16. The multi-emitter laser diode of claim 1, further comprising a tunnel junction situated between the inner waveguide layer associated with the first active region and the inner waveguide layer associated with the second active region.

17. The multi-emitter laser diode of claim 16, wherein the tunnel junction contacts the inner waveguide layer associated with the first active region and the inner waveguide layer associated with the second active region.

18. The multi-emitter laser diode of claim 16, a refractive index of the inner waveguide layer associated with the first active region is substantially the same as a refractive index of the inner waveguide layer associated with the second active region.

19. The multi-emitter laser diode of claim 1, wherein the inner waveguide layer associated with the first active region and the inner waveguide layer associated with the second active region are portions of a common waveguide layer.

20. The multi-emitter laser diode of claim 1, wherein the inner and outer waveguide layers associated with the first active region and the inner and outer waveguide layers associated with the second active region define a common waveguide.

21. An apparatus, comprising:
at least one multi-emitter laser diode as recited in claim 1; and
a fast axis collimator situated to collimate an output beam along a fast axis; and
a slow axis collimator situated to collimate the output beam along a slow axis.

22. An apparatus, comprising:
a multi-emitter laser diode, comprising:
a first active region associated with a lasing wavelength situated between an inner waveguide layer and an outer waveguide layer;
a second active region associated with the lasing wavelength situated between an inner waveguide layer and an outer waveguide layer, wherein the inner waveguide layer of the first active region and the inner waveguide layer of the second active region are situated between the first active region and the second active region, and the first active region and the second active region are situated so that an optical beam propagating in the first active region is optically coupled to the second active region; a fast axis collimator situated to collimate an output beam along a fast axis; and
a slow axis collimator situated to collimate the output beam along a slow axis, wherein the fast axis collimator is situated adjacent the multi-emitter laser diode and includes a phase compensation area that produces a 180 degree phase shift between beam portions so as to produce a symmetric mode from an asymmetric mode.

23. An apparatus , comprising:
a multi-emitter laser diode, comprising:
a first active region associated with a lasing wavelength situated between an inner waveguide layer and an outer waveguide layer;
a second active region associated with the lasing wavelength situated between an inner waveguide layer and an outer waveguide layer, wherein the inner waveguide layer of the first active region and the inner waveguide layer of the second active region are situated between the first active region and the second active region, and the first active region and the second active region are situated so that an optical beam propagating in the first active region is optically coupled to the second active region; a fast axis collimator situated to collimate an output beam along a fast axis; and
a slow axis collimator situated to collimate the output beam along a slow axis, wherein the slow axis collimator is situated in a beam far field and includes a phase compensation area that produces a 180 degree phase shift between beam portions so as to produce a symmetric mode from an asymmetric mode.

24. An apparatus, comprising:
a multi-emitter laser diode, comprising:
a first active region associated with a lasing wavelength situated between an inner waveguide layer and an outer waveguide layer;
a second active region associated with the lasing wavelength situated between an inner waveguide layer and an outer waveguide layer, wherein the inner waveguide layer of the first active region and the inner waveguide layer of the second active region are situated between the first active region and the second active region, and the first active region and the second active region are situated so that an optical beam propagating in the first active region is optically coupled to the second active region;

a fast axis collimator situated to collimate an output beam along a fast axis;

a slow axis collimator situated to collimate the output beam along a slow axis; and a phase compensator situated with respect to the multi-emitter laser diode so as to produce a phase shift between optical beams produced by the first active region and the second active region.

25. The apparatus of claim 24, wherein the phase mask has phase segments so that the phase shift is 180 degrees.

26. The apparatus of claim 24, wherein the multi-emitter laser diode is a coherent double junction laser diode.

27. The apparatus of claim 24, wherein the multi-emitter laser diode is selected to produce an antisymmetric mode or a symmetric mode.

28. A method of pumping a fiber laser, comprising:

producing a coherent beam from a combination of a first optical beam and a second optical beam from a multi-emitter laser diode as recited in claim 1;

adjusting a wavefront phase of at least the first optical beam or the second optical beam; and directing the wavefront phase adjusted beam to a doped optical fiber to produce optical gain in the doped optical fiber.

29. The method of claim 28, wherein the phase is adjusted to produce a symmetric mode or an antisymmetric mode.

30. A method of producing a double-emitter laser diode, comprising:

defining a first laser diode in at least one or more layers on a substrate, wherein the first laser diode includes a first active region associated with a lasing wavelength situated between an inner waveguide layer and an outer waveguide layer;

forming a tunnel junction adjacent the first laser diode;

defining a second laser diode in at least one or more layers adjacent the tunnel junction, the second laser diode including a second active region associated with the lasing wavelength and situated between an inner waveguide layer and an outer waveguide layer, wherein the inner waveguide layer of the first active region and the inner waveguide layer of the second active region are situated between the first active region and the second active region, the first active region and the second active region are situated so that an optical beam propagating in the first active region is optically coupled to the second active region, and the first laser diode and the second laser diode are optically coupled so as to produce coherent first and second laser beams; and producing a 180 degree phase shift between optical beams from the first active region and the second active region with a phase mask to produce a symmetric mode from an asymmetric mode.

31. The method of claim 30, wherein the first laser diode and the second laser diode are optically coupled based on at least one of a separation of the first and second active regions and a refractive index difference.

* * * * *